United States Patent [19]
Hanawa

[11] Patent Number: 6,057,066
[45] Date of Patent: May 2, 2000

[54] METHOD OF PRODUCING PHOTO MASK

[75] Inventor: Tetsuro Hanawa, Tokyo, Japan

[73] Assignee: Mitsubishi Denki Kabushiki Kaisha, Tokyo, Japan

[21] Appl. No.: 09/154,071

[22] Filed: Sep. 16, 1998

[30] Foreign Application Priority Data

Apr. 17, 1998 [JP] Japan .................................. 10-108025

[51] Int. Cl.⁷ ...................................................... G03F 9/00
[52] U.S. Cl. ................................................................ 430/5
[58] Field of Search ............................... 430/5, 322, 324; 378/35

[56] References Cited

U.S. PATENT DOCUMENTS 5,853,923  12/1998  Tzu .............................................. 430/5

FOREIGN PATENT DOCUMENTS 7-64273   3/1995  Japan .
8-279452  10/1996  Japan .

*Primary Examiner*—S. Rosasco
*Attorney, Agent, or Firm*—McDermott, Will & Emery

[57] ABSTRACT

A method of producing a phase shift mask of attenuated type including a step of forming an optical proximity correction in a self-replicating manner in order to weaken side lobe lights by a first phase shift mask of attenuated type including a first pattern, according to which making of data for writing the optical proximity correction at the time of forming by an electron beam lithography system, various transfer tests and/or various optical simulations, and great amount of data for writing in the system are not necessary when the optical proximity correction which is different from in response to each pattern size and/or to each pattern arrangement.

8 Claims, 22 Drawing Sheets

FIGURE 7(a)
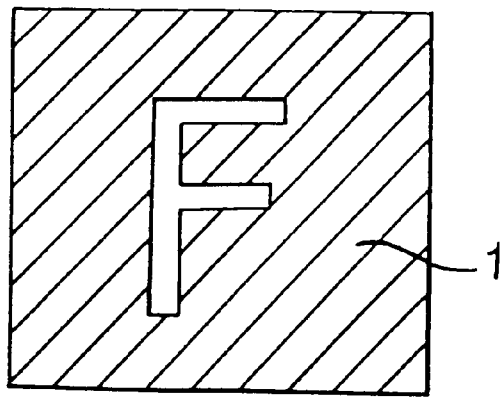
FIGURE 7(b)
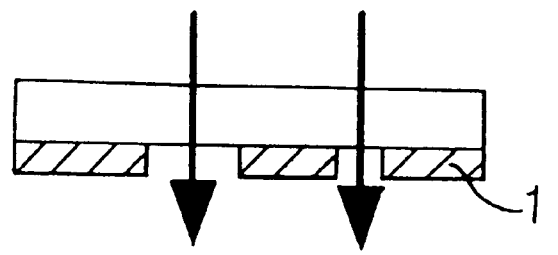
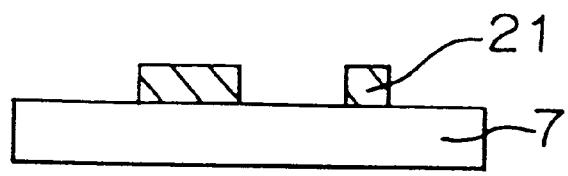
FIGURE 7(c)
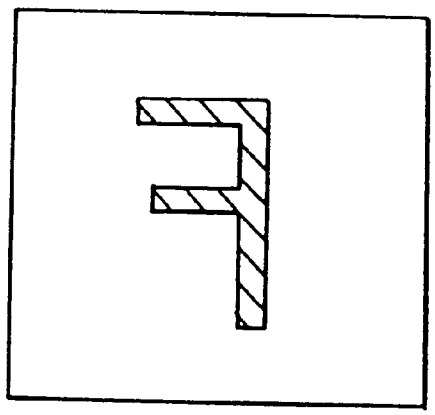

EXPOSURE BY
MIRROR PROJECTION ALIGNER

FIGURE 16 (a) PRIOR ART
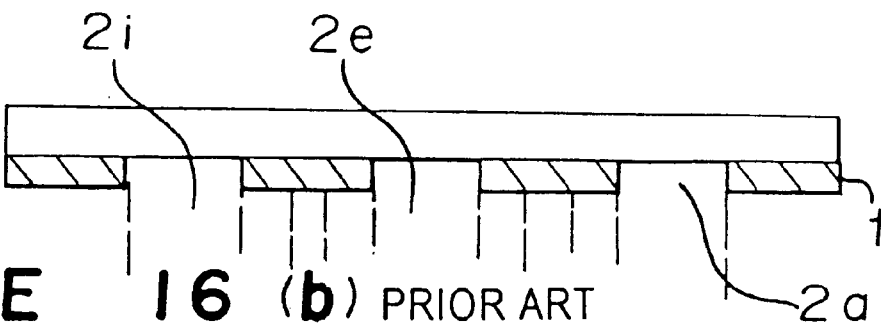
FIGURE 16 (b) PRIOR ART
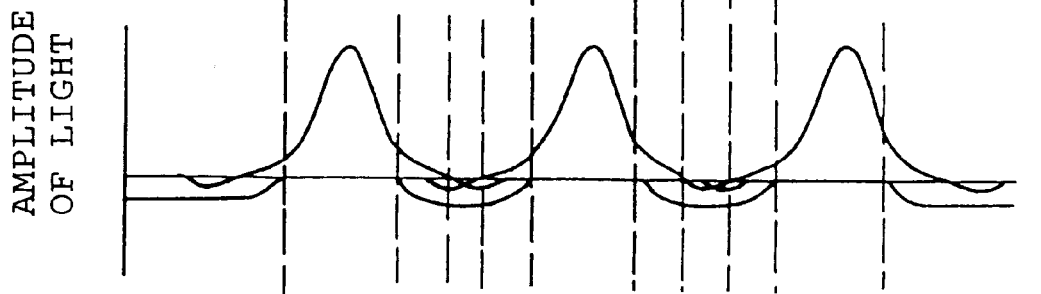
FIGURE 16 (c) PRIOR ART
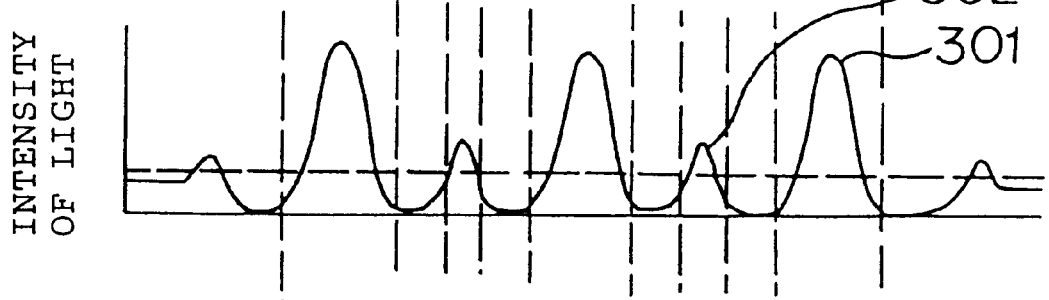
FIGURE 16 (d) PRIOR ART
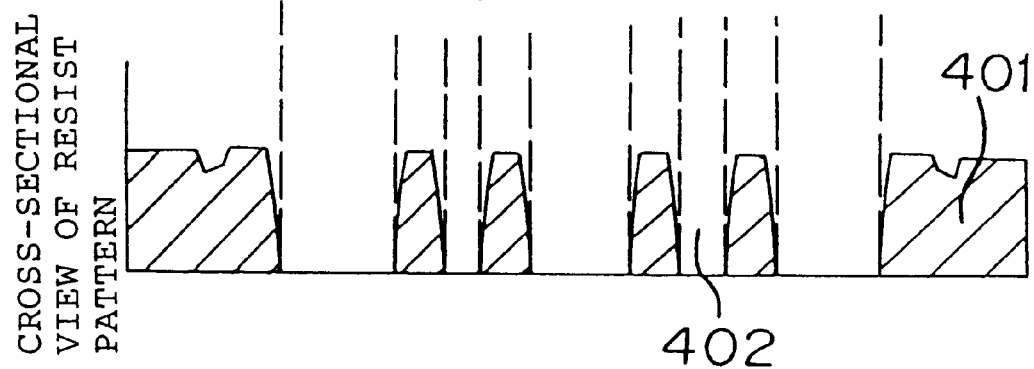

402

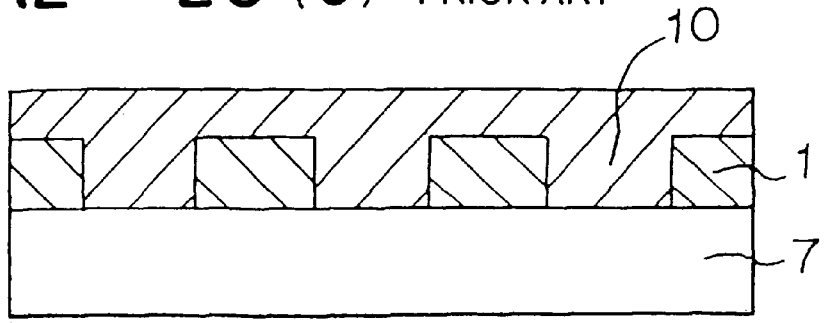
FIGURE 23 (e) PRIOR ART
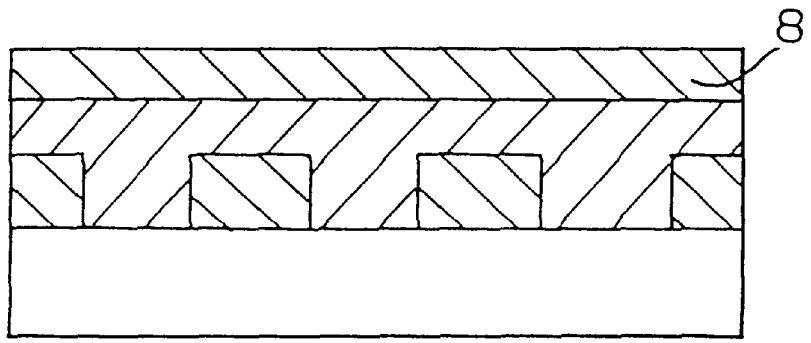
FIGURE 23 (f) PRIOR ART
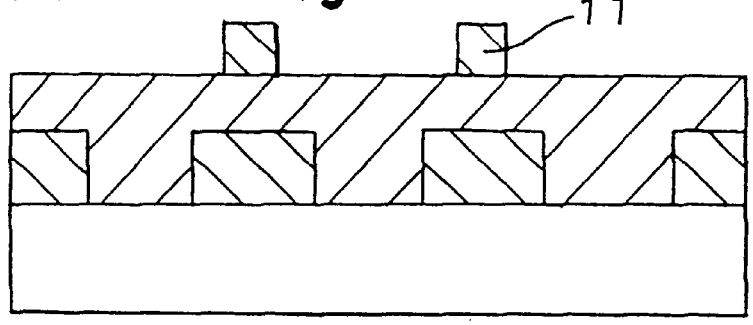
FIGURE 23 (g) PRIOR ART
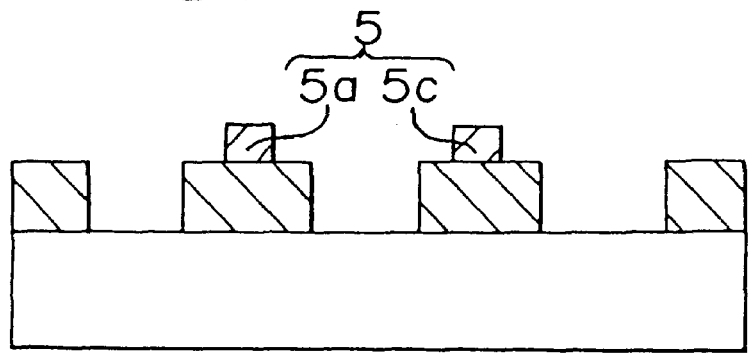
FIGURE 23 (h) PRIOR ART

FIGURE 24 (e) PRIOR ART
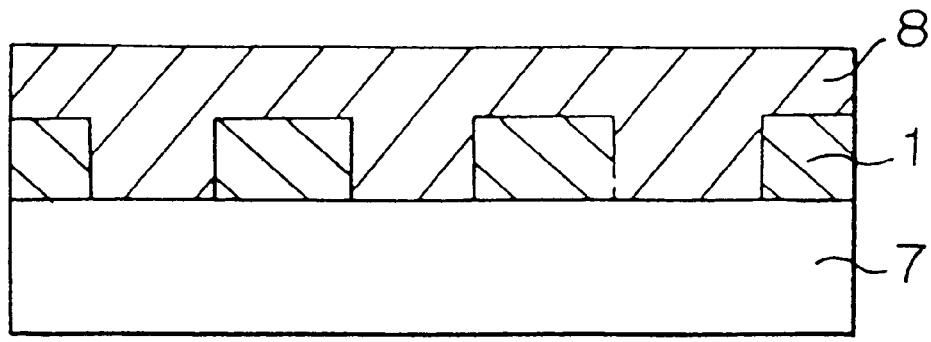
FIGURE 24 (f) PRIOR ART
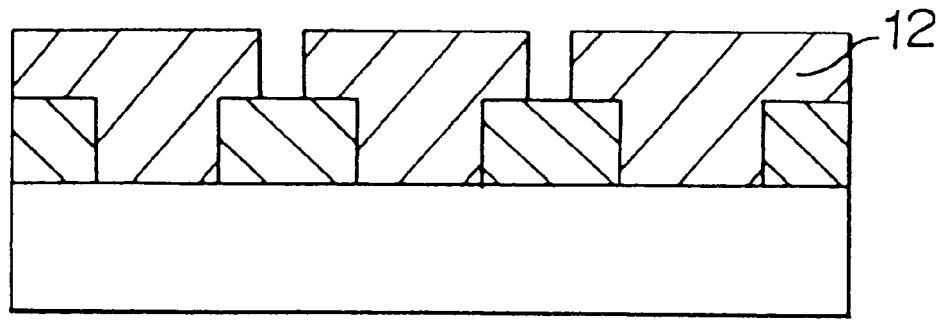
FIGURE 24 (g) PRIOR ART
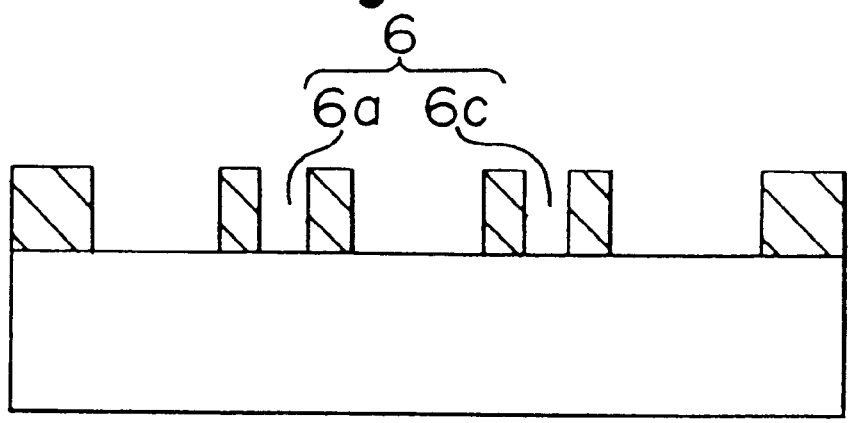

METHOD OF PRODUCING PHOTO MASK

BACKGROUND OF THE INVENTION

1. Field of the Invention

The present invention relates to a method of producing a phase shift mask of attenuated type, particularly to a method of forming an optical proximity correction for weakening side lobe lights in the phase-shift mask of attenuated type.

2. Discussion of Background

In recent years, microminiaturization of a circuit pattern is increasingly pursued in accordance with large integration of a semiconductor integrated circuit. Specifically, photolithography technology plays the most important role in forming such a microminiature circuit pattern. A main subject in the photolithography technology resides in how accurately a microminiature resist pattern is formed. For this, a major problem to be solved is to improve resolution into a pattern and a depth of focus. There have been proposed many technologies for improving this resolution and this depth of focus. In these technologies, a method of improving a photo mask has been paid special attention to because the method is simple and practical. Among various types of technologies concerning the improved photo masks, for example, a phase shift mask of attenuated type reported by N. Yoshioka et al.,: IEDM (International Electron Devices Meeting) 93, P. 653 (1993) has been especially paid attention to and has been practically used in these days because the mask has many advantages not provided in the other improved photo masks, such as applicability of the conventional process using a positive resist and small restriction against pattern layout.

This phase shift mask of attenuated type can improve contrast of edge portions of an optical image and, particularly, is effective for improving resolution and a depth of focus of a pattern of isolated holes by providing a phase shift film of attenuated type having a transmittance of about 2% through 20% with respect to a wavelength of exposure and a phase shift of 180° with respect to an aperture, instead of an ordinary shading film of photo mask.

However, in such a phase shift mask of attenuated type, there remains problems with pattern layout. FIG. 15 is a plan view for showing a conventional phase shift mask of attenuated type. In the Figure, a numerical reference 1 designates a phase shift film of attenuated type; a numerical reference 2 designates a pattern with concentrated apertures composed of rectangular apertures 2a through 2i formed by opening the phase shift film of attenuated type; and numerical references 3 and 4 respectively designate patterns with an isolated aperture composed of a rectangular aperture.

The phase shift mask of attenuated type includes the patterns with an isolated aperture 3 and 4 which do not have any aperture around the periphery thereof and the pattern with concentrated apertures 2 having a plurality of apertures which are arranged in the directions of X and Y in an array-like shape and of which opening width $W_1$ and a width between adjacent openings $W_2$ in the X direction (or the Y direction) are in a ratio of about 1:1 through 1:2. In a case that a resist pattern is formed using such mask, when a luminous exposure is optimized using the pattern with an isolated aperture 3 or 4, a pattern defect called as a dimple is generated in portions designated by A through D in the pattern with concentrated apertures 2 shown in FIG. 15, wherein such dimple was not originally anticipated in making design data.

In FIGS. 16(a) through 16(d), a schematical view for explaining a reason for generating such defect of resist pattern is shown. FIG. 16(a) shows a cross-sectional view of the conventional phase shift mask of attenuated type taken along a line I—I of FIG. 15; FIG. 16(b) shows amplitude in a wafer face of exposure light transmitted through the photo mask; FIG. 16(c) shows intensity of the exposure light on the wafer face; and FIG. 16(d) shows a cross-sectional view of a resist pattern formed by the exposure light.

For example, the exposure lights transmitted through apertures 2i, 2e and 2a of the pattern with concentrated apertures 2 and the exposure lights transmitted through the phase shift mask of attenuated type 1 overlap partially each other in an exposed region by the exposure lights transmitted through the phase shift film of attenuated type 1 as shown in FIG. 16(b). Because of these overlaps of the exposure lights, a side lobe light 302 having large intensity was generated in the exposed region of the phase shift film of attenuated type 1 as shown in FIG. 16(c). As a result, as shown in FIG. 16(d), the resist in other than a region which should have inherently been exposed by only a main peak light 301 transmitted through the aperture 2i, 2e or 2a was exposed by the side lobe light, whereby a pattern defect 402 with a loss of the resist, which has not been planed in original design data, occurred in the resist pattern 401.

In the above description, only the overlap of exposure lights from adjacent apertures in the line I—I is considered. However, this overlap practically was two-dimensional, whereby more exposure lights were overlapped and the intensity of side lobe light at the portions A through D, which were symmetric portions with respect to the apertures, became the strongest.

FIG. 17 is a picture in a plan view taken by a scanning electron microscope (SEM) when a resist pattern is actually formed on a wafer using the conventional phase shift mask of attenuated type. In this Figure, a pattern defect 402 was generated at a periphery of a resist aperture.

In the U.S. Pat. Nos. 5,487,963 and 5,591,550, there is proposed phase shift masks of attenuated type which restrict occurrence of pattern defects by forming an optical proximity correction formed by a shading film or apertures at portions corresponding to portions, at which side lobe lights are generated, in order to cope with pattern defects that occur at a time of using such conventional phase shift mask of attenuated type. FIGS. 18 and 19 respectively are a plan view of the conventional phase shift mask of attenuated type provided with a shading film as an optical proximity correction in the phase shift mask of attenuated type shown in FIG. 15 and a cross-sectional view taken along a line II—II of this plan view. FIGS. 20 and 21 respectively are a plan view of the conventional phase shift mask of attenuated type provided with apertures as an optical proximity correction and a cross-sectional view taken along a line III—III of this plan view.

These methods were to relax overlaps of exposure lights and reduce side lobe lights by disposing an optical proximity correction 5 made of, for example, a shading film 5a on the corresponding portions to those with the side lobe lights generated in the phase shift mask of attenuated type 1 or by providing an optical proximity correction 6 formed by, for example, an aperture 6a of the phase shift mask of attenuated type 1.

In the next, a method of producing a phase shift mask of attenuated type having such-optical proximity correction will be described.

At first, a method of producing a phase shift mask of attenuated type having an optical proximity correction made of a shading film will be described.

FIGS. 22(a) through 22(d) and FIGS. 23(e) through 23(h) respectively are cross-sectional views of the mask taken along the line II—II of FIG. 18 for showing processes of producing the phase shift mask of attenuated type shown in FIG. 18.

In FIG. 22(a), a phase shift film of attenuated type is formed on a light transmittible substrate. In the next, a resist for electron beam 8 is formed on the phase shift film of attenuated type 1. As shown in FIG. 22.(c), an electron beam is irradiated upon the resist for electron beam 8 depending on pattern data of an electron beam lithography system for forming the pattern of apertures shown in FIG. 18; thereafter the resist is developed to thereby obtain a desirable resist pattern for electron beam. As shown in FIG. 22(d), the phase shift film of attenuated type 1 is etched using this resist pattern 9 as a mask and thereafter the unnecessary resist is removed in order to form a pattern with concentrated apertures formed by the apertures 2a through 2i in the phase shift mask of attenuated type 1. In this, the photo mask completed at this step is the conventional phase shift mask of attenuated type without the optical proximity correction described in the above.

In the next, in FIG. 23(e), a shading film 10 is formed on the phase shift film of attenuated type 1 in which the pattern with concentrated apertures is formed and the light transmittible substrate 7 which is exposed. As shown in FIG. 23(f), a resist for electron beam 8 is formed again on the shading film 10. As shown in FIG. 23(g), an electron beam is irradiated on the resist for electron beam 8 based on the data of pattern of the electron beam lithography system for writing the optical proximity correction, and thereafter the resist is developed to thereby obtain a resist pattern for electron beam 11. In this, the data of pattern for writing such optical proximity correction are obtained by conducting various transfer tests, various optical simulations or the like, for example, a resist pattern is practically formed using the conventional phase shift mask of attenuated type without an optical proximity correction in order to obtain data concerning originating portions of pattern defects, conditions of a transfer and so on, which are generated with respect to different pattern sizes and pattern alignment. As shown in FIG. 23(h), the shading film 10 is subjected to an etching using this resist pattern 11 as a mask and thereafter the unnecessary resist is removed, whereby the phase shift mask of attenuated type having the optical proximity correction 5 composed of the shading films 5a and 5c is completed.

In the next, a method of producing a phase shift mask of attenuated type having an optical proximity correction formed by apertures will be described. The method of producing is processed as shown in the FIGS. 22(a) through FIG. 22(d) and further the FIGS. 24(e) through FIG. 24(g), which are cross-sectional views of the mask for showing the manufacturing process.

As shown in FIG. 24(e), a resist for electron beam 8 is again formed on the phase shift mask of attenuated type 1. As shown in FIG. 24(f), an electron beam is irradiated to the resist for electron beam 8 based on data of pattern of an electron beam lithography system for writing an optical proximity correction, and thereafter the resist is developed, to thereby obtain a resist pattern 12. In this, the data of pattern of the optical proximity correction are obtained by conducing various transfer tests, various optical simulations or the like as in the above case of forming the optical proximity correction composed of the above shading portions. As shown in FIG. 24(g), a part of the phase shift film of attenuated type 1 is etched using this resist pattern 12 as a mask and the unnecessary resist is removed, whereby the phase shift mask of attenuated type having the optical proximity correction 6 composed of apertures 6a and 6c is completed.

However, the method of producing the phase shift mask of attenuated type having the conventional optical proximity correction had problems that the method was not practically applicable such that the cost of production was high and throughput was very low, because in order to optimize the optical proximity correction, which were different at each pattern size or at each pattern arrangement, the phase shift mask constructed as described in the above required, for example, various transfer tests, various optical simulations or the like by practically patterning the resist using the phase shift mask of attenuated type without the optical proximity correction to obtain data about a location of the optical proximity correction and data about conditions of the transfer, making of data of the pattern for writing the optical proximity correction of the electron beam lithography system based on thus obtained data, and a very large amount of data for writing for electron beam.

SUMMARY OF THE INVENTION

It is an object of the present invention to solve the above-mentioned problems inherent in the prior art and to provide a method of producing a phase shift mask of attenuated type which does not require transfer tests and optical simulations for optimizing an optical proximity correction, making of data for writing used by an electron beam lithography system, and a very large amount of data for writing, even in a case of forming the optical proximity correction which is different at each pattern size and at each pattern arrangement.

According to a first aspect of the present invention, there is provided a method of producing a phase shift mask of attenuated type comprising a step of forming an optical member on a main surface of a light transmittible substrate, a step of forming a first resist film on the optical member, a step of forming a first resist pattern made of the first resist film using a first phase shift mask of attenuated type including a first pattern formed by a plurality of apertures provided in a phase shift film of attenuated type and arranged so as to produce side lobe lights, a step of forming a second pattern made of the optical member obtained by etching a part of the optical member using the first resist pattern as a mask, a step of forming a second resist film on the second pattern, a step of forming a second resist pattern made of the second resist film formed so as to cover at least portions of the second pattern in correspondence with the side lobe lights, and a step of etching the residual portions of the optical member using the second resist pattern as a mask.

According to a second aspect of the present invention, first data of pattern of the first phase shift mask of attenuated type is formed based on second data of pattern obtained by converting the first data of pattern in an electron beam lithography system so that the right side of the first data is inverted left.

According to a third aspect of the present invention, the optical member is made of a phase shift film of attenuated type, and portions formed in correspondence with the side lobe lights are configured by apertures in the phase shift film of attenuated type.

According to a fourth aspect of the present invention, the optical member is composed of a phase shift film of attenuated type and a shading film formed on the phase shift film of attenuated type, and the portions formed in correspondence with the side lobe light are made of the shading film.

According to a fifth of the present invention, the first resist film is a positive resist, and a luminous exposure is adjusted such that the width of aperture in the first resist pattern formed in correspondence with one aperture in the first pattern of the first phase shift mask of attenuated type is narrower than the width of the one aperture of the first pattern.

According to a sixth aspect of the present invention, the first resist film is a negative resist, and a luminous exposure is adjusted such that the width of residual portion of the first resist pattern formed in correspondence with one aperture in the first pattern of the first phase shift mask of attenuated type is narrower than the width of the one aperture in the first pattern.

According to a seventh aspect of the present invention, the wavelength of an exposure light for exposing the first resist film is the same as the wavelength of an exposure light used by an exposure system for producing a semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 7(a) through 7(c) are schematical views for showing processes of transferring a pattern image in accordance with Embodiment 1 of the present invention;

FIGS. 16(a) through 16(d) are schematical views for showing steps of forming a resist pattern using a conventional phase shift mask of attenuated type;

FIGS. 23(e) through 23(h) are cross-sectional views of a phase shift mask of attenuated type having a conventional optical proximity correction made of a shading film for explaining manufacturing processes;

FIGS. 24(e) through 24(g) are cross-sectional views of a phase shift mask of attenuated type having a conventional optical proximity correction formed by apertures for explaining manufacturing processes.

DETAILED DESCRIPTION OF THE PREFERRED EMBODIMENTS

A detailed explanation will be given of preferred embodiments of the present invention in reference to FIGS. 1 through 14(h) as follows, wherein the same numerical references are used for the same or the similar portions and description of these portions is omitted.

EMBODIMENT 1

At first, a first phase shift mask of attenuated type and a method of producing this will be described.

Figure 1:
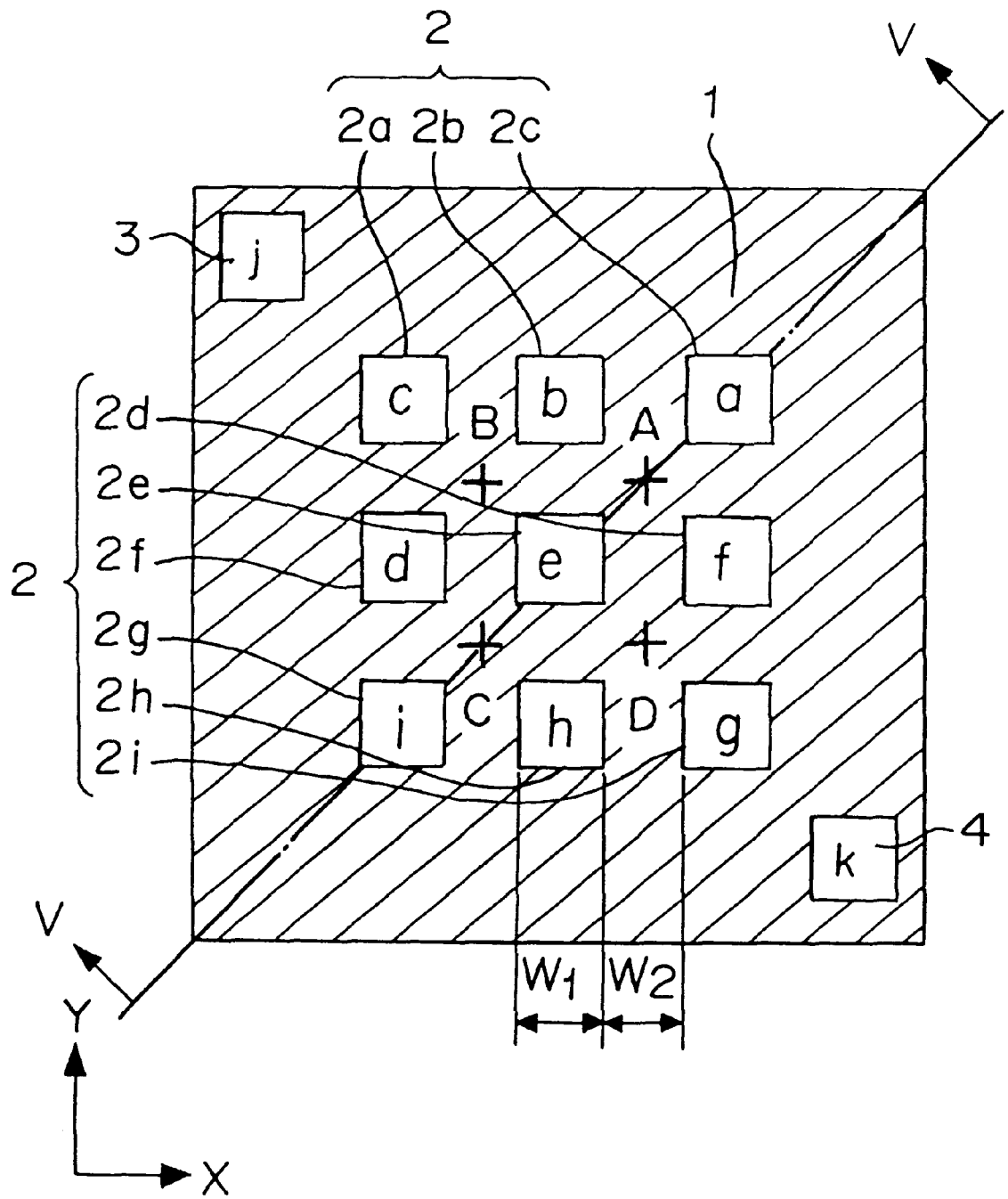
FIG. 1 is a plan view of a first phase shift mask of attenuated type according to Embodiment 1 of the present invention.
Figure 2:
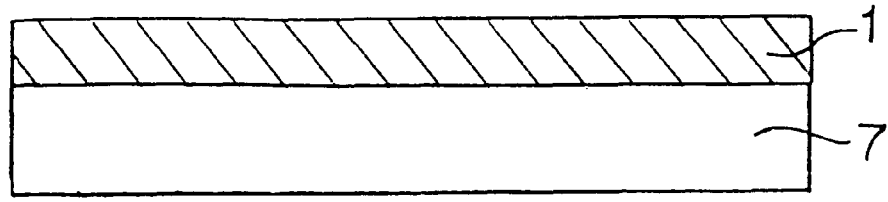
FIGS. 2(a) through 2(d) are cross-sectional views of the first phase shift mask of attenuated type for explaining manufacturing processes in accordance with Embodiment 1.
Figure 2:
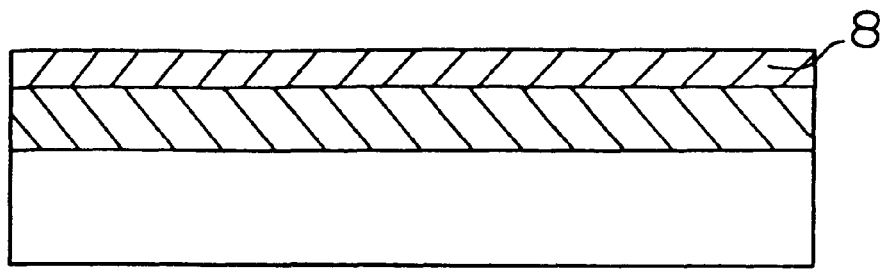
Figure 2:
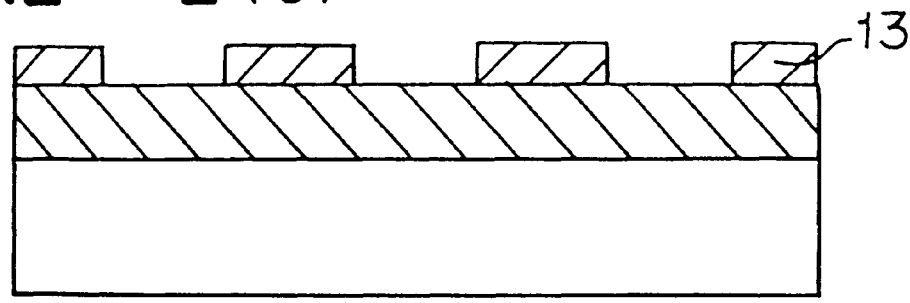
Figure 2:
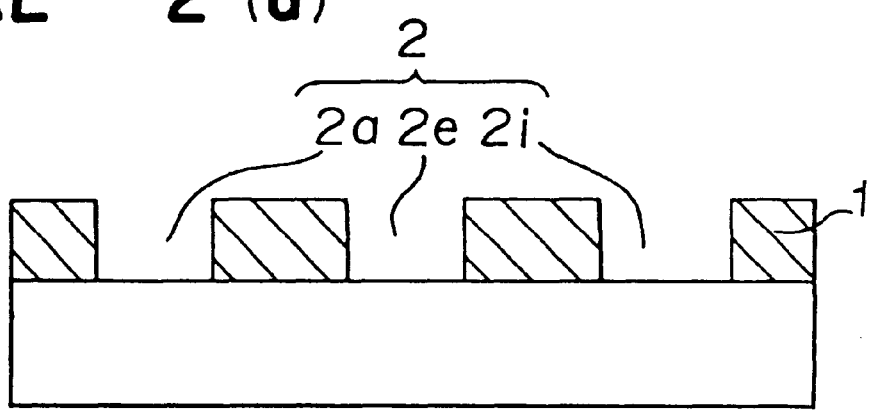

FIG. 1 is a plan view of a first phase shift mask of attenuated type viewed from a side of pattern face thereof. In FIG. 1, a numerical reference 1 designates the phase shift mask of attenuated type; a numerical reference 2 designates a pattern with concentrated apertures composed of rectangular apertures 2a through 2i; and numerical references 3 and 4 designate patterns with an isolated aperture. Alphabetical references a through i are respectively attached to the apertures for the convenience.

This first phase shift mask of attenuated type includes isolated patterns of the apertures 3 and 4 (j, k) around which other apertures are not provided and a pattern with concentrated apertures 2 formed by a plurality of apertures 2a through 2i (a through i), which are arranged in the directions of X and Y as a first pattern and the width of aperture $W_1$ in the X direction or the Y direction and the width between adjacent apertures $W_2$ are substantially in a ratio of 1:1 through 1:2.

When a phase shift mask having such a pattern with concentrated apertures is used to form a resist pattern, side lobe light having a strong intensity is generated and thereby pattern defects occur because a part of exposure lights transmitted through adjacent apertures and an exposure light transmitted through the phase shift film of attenuated type overlap. The side lobe light becomes the strongest at points of symmetry, such as positions A through D in FIG. 1, at which the number of overlapping exposure lights is maximum. Further, in a case that such pattern with an isolated aperture and such pattern with concentrated apertures are simultaneously provided, conditions of exposure are ordinarily optimized by the pattern with an isolated aperture. However, such optimization results in excessive exposure at the pattern with concentrated apertures, in particular, the intensity 10 of side lobe light becomes strong.

Further, the apertures 2a through 2i and the apertures 3 and 4 shown in FIG. 1 are in a rectangular shape. However, the resist pattern practically formed using this photo mask becomes in a circular shape with its corners chamfered.

In the next, a method of producing this phase shift mask of attenuated type will be described. FIGS. 2(a) through 2(d) are cross-sectional views of the mask for explaining manufacturing processes of the phase shift mask of attenuated type. These cross-sectional views are taken along a line V—V shown in FIG. 1. In the Figures, a numerical reference 1 designates a phase shift film of attenuated type; a numerical reference 2 designates a pattern with concentrated apertures; a numerical reference 7 designates a light transmittible substrate; a numerical reference 8 designates a resist film for electron beam; and a numerical reference 13 designates a resist pattern for electron beam.

At first, as shown in FIG. 2(a), the phase shift film of attenuated type 1 is formed to be a film thickness of 500 Å through 2000 Å. The phase shift film of attenuated type 1 is made of materials such as a Cr system or a MoSiON system having a transmittance of about 2 through 20% with respect to a wavelength of exposure and a phase shift of 180° with respect to an aperture of the light transmissible substrate. As shown in FIG. 2(b), the resist for electron beam 8 is formed on the phase shift film of attenuated type 1. Further, as shown in FIG. 2(c), a resist pattern for electron beam 13 is obtained such that data of a second pattern in an electron beam lithography system for forming a pattern including the patterns with an isolated aperture 3, 4 as shown in FIG. 1 and the pattern with concentrated apertures 2 as the first pattern is used to irradiate an electron beam on the resist for electron beam 8 and thereafter it is developed. In this, the second data of pattern are obtained by converting the first data of pattern such that the second data represent a resist pattern in which the right side thereof is inverted to be the left with respect to the resist pattern obtained by the first data of pattern in the electron beam lithography system, which is used at a time of producing the phase shift mask of attenuated type having an optical proximity correction to be described below. As shown in FIG. 2(d), the phase shift mask of attenuated type 1 is etched using the resist pattern for electron beam 13 as a mask; and thereafter, the unnecessary resist is removed to complete a first phase shift mask of attenuated type including the pattern with concentrated apertures 2 and the patterns with an isolated aperture (not shown).

In the next, a method of producing a phase shift mask of attenuated type having an optical proximity correction using this first phase shift mask of attenuated type will be described.

FIGS. 3(a) through 3(d) and 4(e) through 4(h) are cross-sectional views of a mask for explaining steps of producing the phase shift mask of attenuated type having the optical proximity correction using the first phase shift mask of attenuated type. These cross-sectional views are taken along a line V—V in the first phase shift mask of attenuated type shown in FIG. 1.

In FIGS. 3(a) through 3(d), a numerical reference 10 designates a shading film; a numerical reference 14 designates a negative resist film, a numerical reference 15 designates an optical proximity correction of resist; a numerical reference 16 designates a pattern of negative resist; a numerical reference 17 designates an optical proximity correction; a numerical reference 18 designates a pattern of shading film; a numerical reference 19 designates a resist pattern for electron beam; and a numerical reference 20 designates a pattern of concentrated apertures. The other numerical references designate portions being the same as or similar to the references shown in FIG. 2.

Figure 3A:
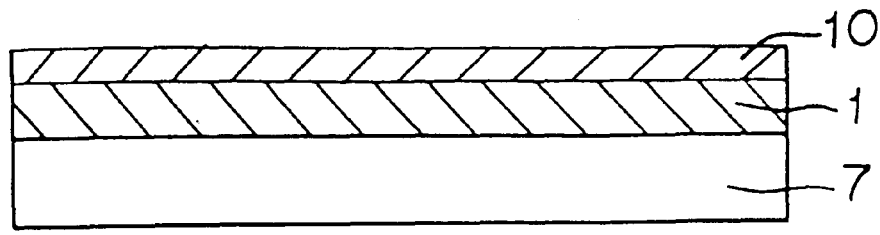
FIGS. 3(a) through 3(d) are cross-sectional views of a phase shift mask of attenuated type having an optical proximity correction for explaining manufacturing processes in accordance with Embodiment 1 of the present invention.
Figure 3B:
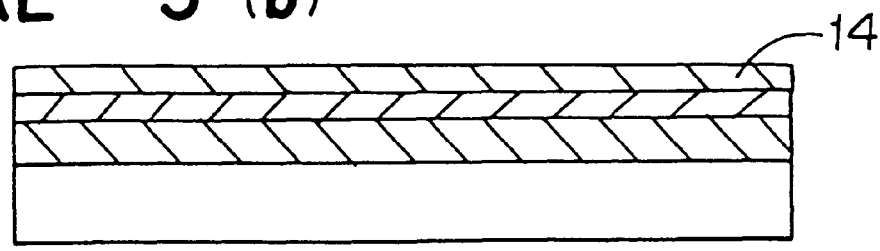
Figure 3C:
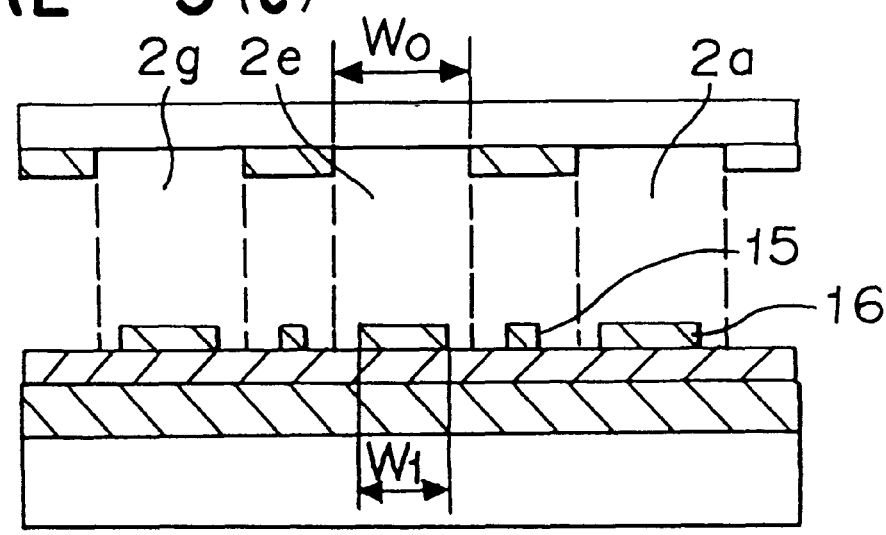

As shown in FIG. 3(a), the phase shift film of attenuated type 1 and the shading film 10, both of which are optical members, are formed on the transmittible substrate 7 to be a film thickness of 500 Å through 2000 Å in a sequential manner, respectively. The phase shift film 1 is the phase shift film of attenuated type of a Cr system or a MoSiON system, which has a transmittance of about 2% through 20% with respect to a wavelength of exposure and a phase shift of 180° with respect to the apertures of the light transmittible substrate 1. Further, the shading film 10 is made of materials such as Cr or MoSi. As shown in FIG. 3(b), the negative resist film 14 is formed on the shading film 10 as the first resist film. Further, as shown in FIG. 3(c), the negative resistance film is exposed by an exposure system of 1:1 with the above-mentioned first phase shift mask of attenuated type providing as a photo mask. After the exposure, it is developed to thereby form the negative resist pattern 16 made of the negative resist film and including the pattern of optical proximity correction 15, as the first resist pattern. This pattern of optical proximity correction 15 is formed in a self-replicating manner on a region, in which the optical proximity correction should be formed, by side lobe light generated by overlaps of exposure light transmitted through the mask. Further, a luminance exposure is adjusted such that a width $W_1$ of thus obtained negative resist pattern 16 is narrower than width $W_0$ of the aperture 2e of the first phase shift mask of attenuated type which is originally planed to form. This amount of reduction $(W_0-W_1)$ is preferably about 0.15 μm in consideration of accuracy in producing the mask.

Figure 3D:
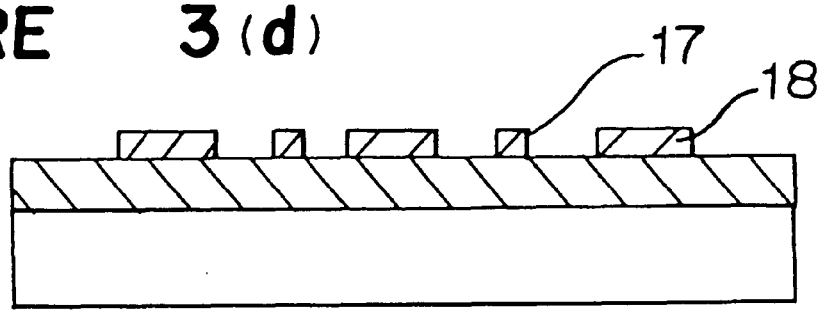

The wave length of the exposure light which is used for this exposure is preferably the same wavelength as that of exposure system which is used at the time of producing the semiconductor device, for example, an line beam (wavelength of 365 nm), a KrF laser beam (wavelength of 248 nm) and an ArF laser beam (wavelength of 193 nm). By using these wavelengths, it is possible to reproduce a preferable pattern of optical proximity correction 15, which is formed in correspondence with the side lobe light. Further, as shown in FIG. 3(d), the shading film 10 is etched by using the negative resist pattern 16 including the pattern of optical proximity correction 15 as a mask, and thereafter, the pattern of shading film 18 as the second pattern including the optical proximity correction 17 made of the shading film is formed by removing the unnecessary resist.

Figure 4E:
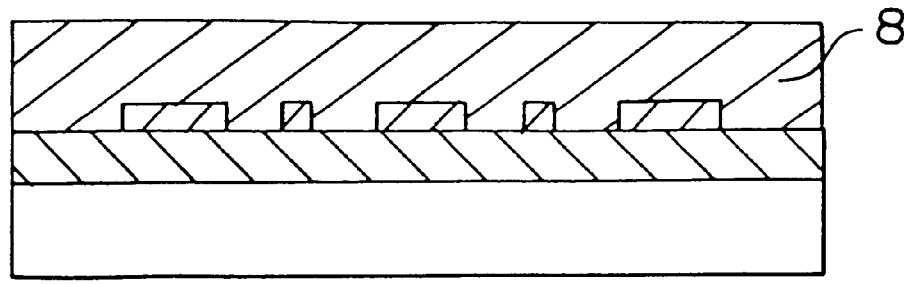
FIGS. 4(e) through 4(h) are cross-sectional views of a phase shift mask of attenuated type having an optical proximity correction for explaining manufacturing processes in accordance with Embodiment 1 of the present invention.
Figure 4F:
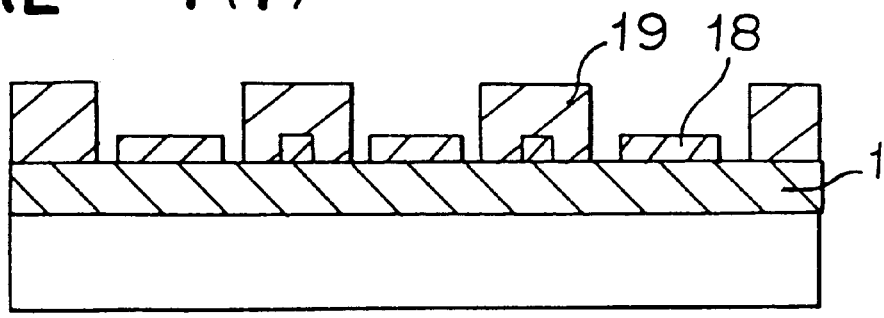
Figure 4G:
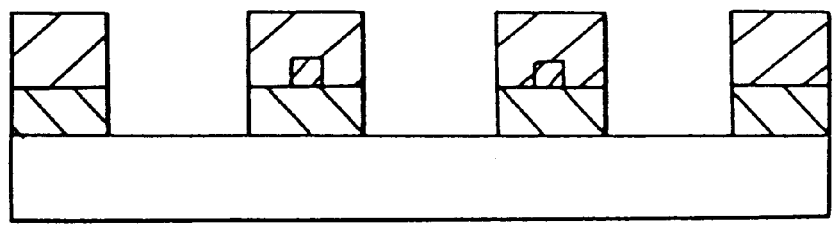
Figure 4H:
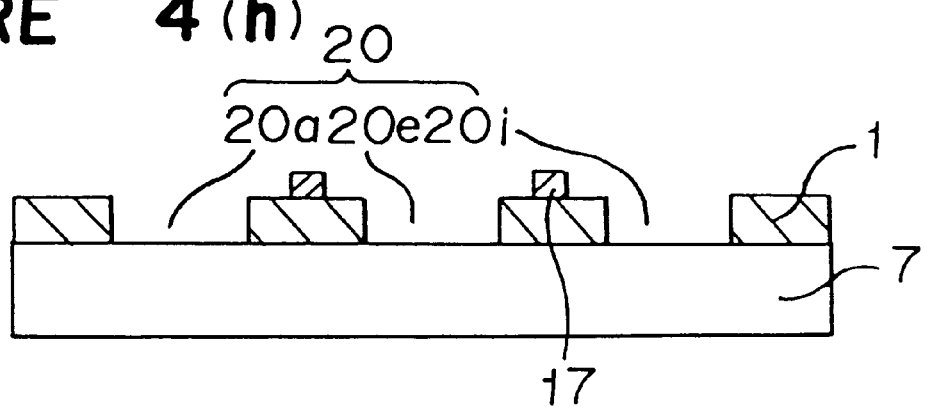

As shown in FIG. 4(e), a resist for electron beam 8 is formed on the whole surface of the pattern of shading film 18 including the optical proximity correction 17. In the next, as shown in FIG. 4(f), an electron beam is irradiated on the resist film for electron beam 8 based on the first data of pattern in the electronic lithography system; and thereafter it is developed to thereby obtain the resist pattern for electron beam 19 as the second resist pattern. Thus formed resist pattern for electron beam 19 is configurated such that only portions corresponding to the optical proximity correction 17 are covered and the pattern of shading film 18 is not covered. This is because the width $W_1$ of negative resist pattern 16 is formed so as to be narrower than the width $W_0$ of the aperture 2e of the first phase shift mask of attenuated type and so on and further the pattern of shading film 18 is formed by etching using the negative resist pattern 16 as a mask. The resist pattern for electron beam 19 formed by the first data of pattern is formed by inverting the right side left with respect to the resist pattern for electron beam 13 shown in FIG. 2(c), which shows the step of producing the first phase shift mask of attenuated type. As shown in FIG. 4(g), the pattern of shading film 18 and the phase shift film of attenuated type 1 are etched using the resist pattern for electron beam 19 as a mask, and thereafter, as shown in FIG. 4(h), the phase shift mask of attenuated type having the pattern with concentrated apertures 20a, 20e and 20i and the optical proximity correction 17 made of the shading film is completed by removing the unnecessary resist. Meanwhile, FIG. 5 is a plan view of thus completed phase shift mask of attenuated type having thus completed optical proximity correction.

In the next, the resist pattern formed by using thus produced phase shift mask of attenuated type having the optical proximity correction will be described.

Figure 5:
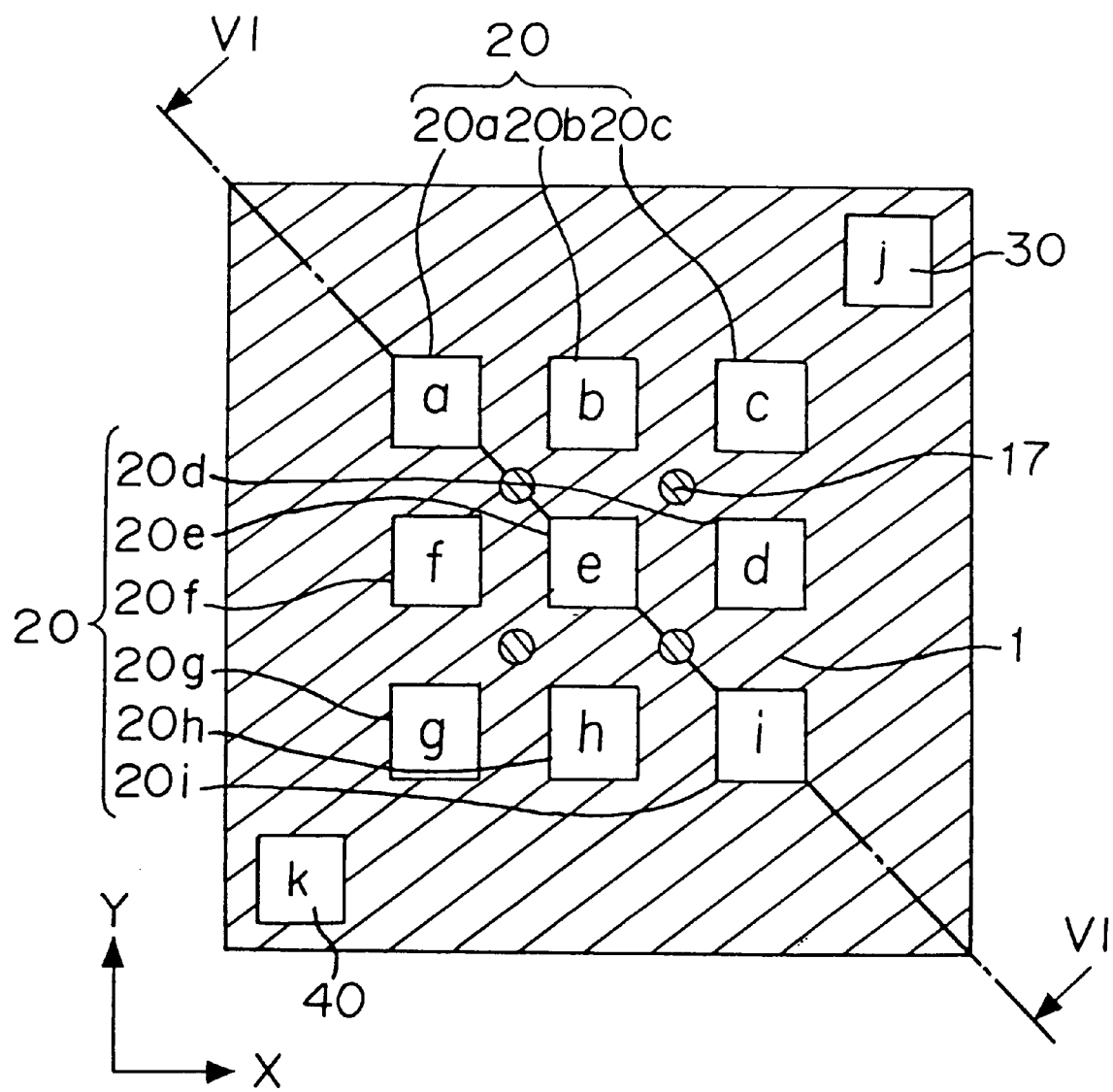
FIG. 5 is a plan view of the phase shift mask of attenuated type having an optical proximity correction in accordance with Embodiment 1 of the present invention.

FIGS. 6(a) through 6(d) show cross-sectional views of the phase shift mask of attenuated type produced by the above method taken along a line VI—VI in FIG. 5, amplitude of an exposure light transmitted through the phase shift mask of attenuated type on the wafer surface, intensity of exposure light on the wafer surface and a cross-sectional view of the formed positive resist pattern. In FIGS. 6(a) through 6(d), a numerical reference 311 designates a main peak light; a numerical reference 312 designates a side lobe light; and a numerical reference 511 designates a positive resist pattern. The other numerical references designate portions the same as or similar to those shown in FIGS. 3(a) through 3(d) and FIGS. 4(e) through 4(h).

Figure 6A:
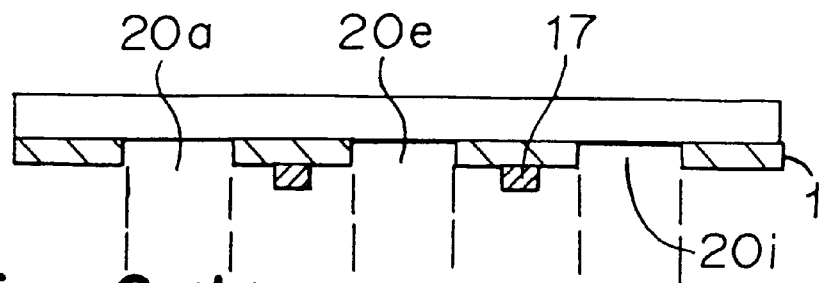
FIGS. 6(a) through 6(d) are schematical views for showing steps of forming the resist pattern in accordance with Embodiment 1 of the present invention.
Figure 6B:
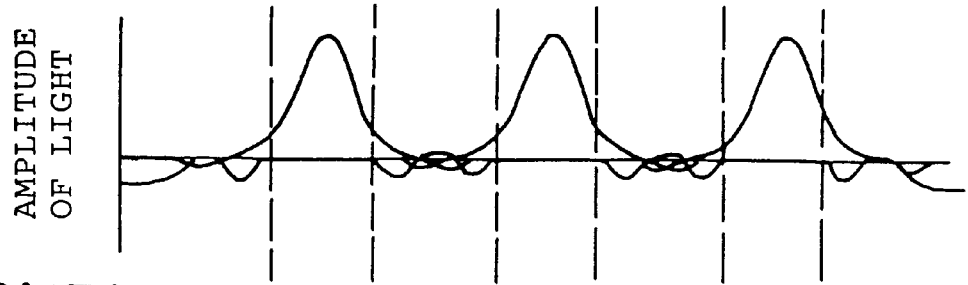
Figure 6C:
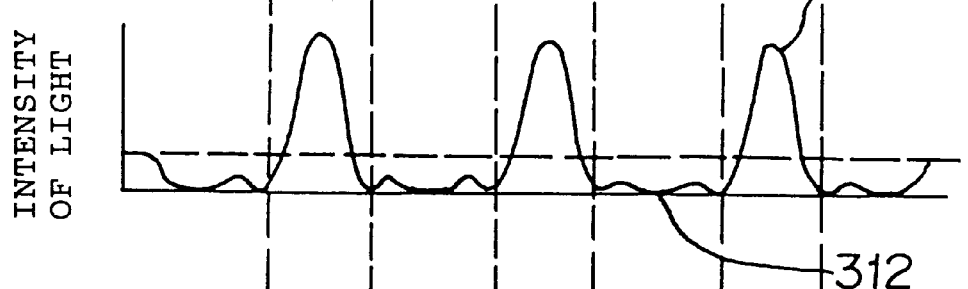
Figure 6D:
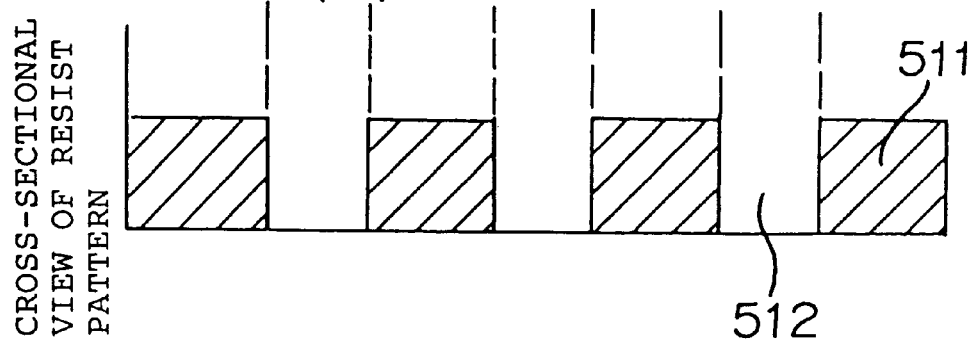
Figure 8:
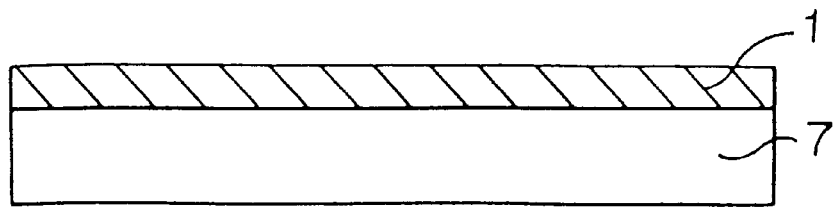
FIGS. 8(a) through 8(d) are cross-sectional views of a phase shift mask of attenuated type having an optical proximity correction for explaining manufacturing processes in accordance with Embodiment 2 of the present invention.
Figure 8:
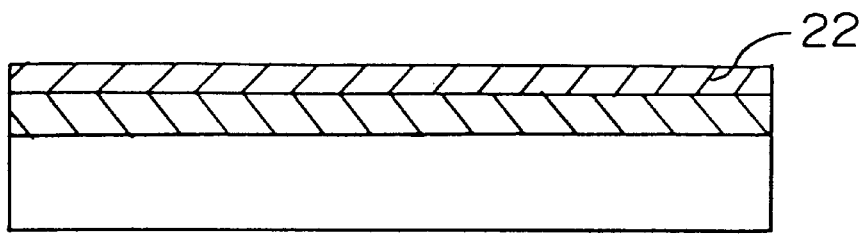
Figure 8:
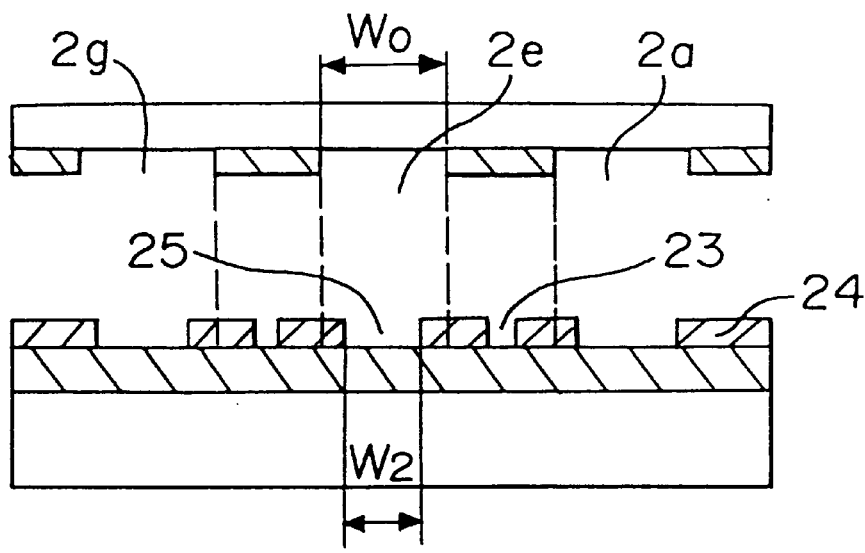
Figure 8:
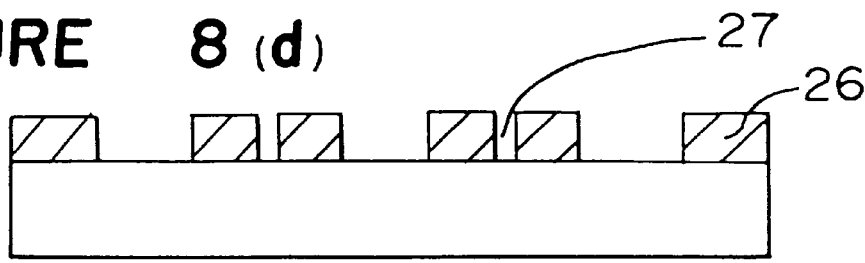
Figure 9:
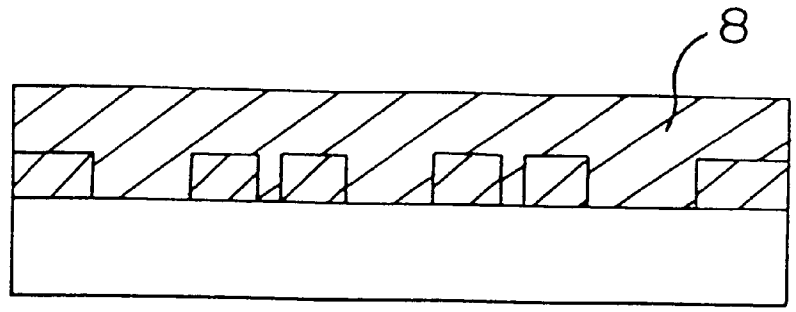
FIGS. 9(e) through 9(h) are cross-sectional views of a phase shift mask of attenuated type having an optical proximity correction for explaining manufacturing processes in accordance with Embodiment 2 of the present invention.
Figure 9:
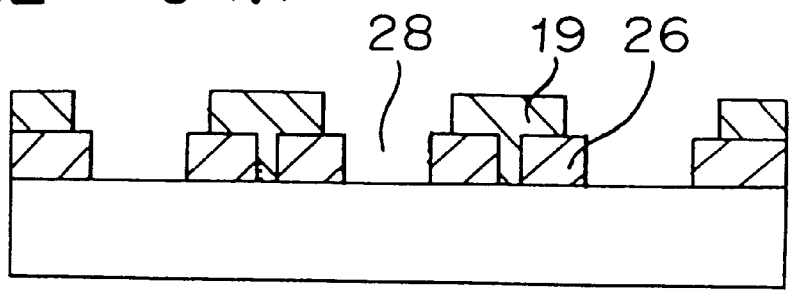
Figure 9:
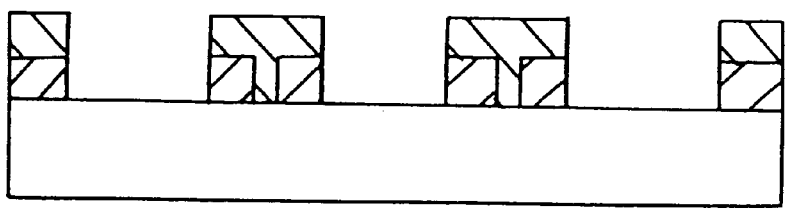
Figure 9:
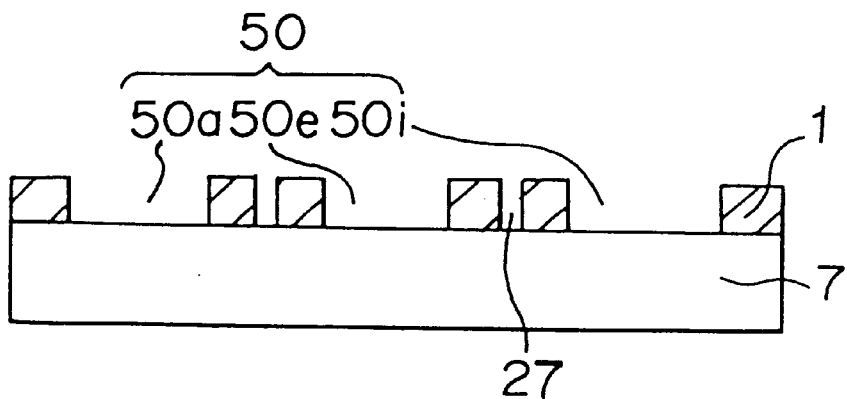

An exposure light transmitted through the phase shift mask of attenuated type overlaps mutually in areas exposed by the light transmitted through the phase shift film of attenuated type, and a side lobe light 312 is generated as shown in FIG. 6(c). However, because the optical proximity correction 17 made of a shading film is provided at a portion corresponding to the area, the intensity of the side lobe light 312 caused by the overlap is extremely weakened. Accordingly, a loss of the resist film is not caused by such side lobe light having weak intensity, and the resist pattern 511 having a resist pattern aperture 512 as designed is formed as shown in FIG. 6(d).

In conducting the above method, a reason for inverting the right side of the resist pattern for electron beam 13 left with respect to the second resist pattern of at the time of producing the first phase shift mask of attenuated type will be described.

In FIGS. 7(a) through 7(c), steps of transferring a pattern image of the phase shift mask of attenuated type to the resist film on a light transmittible substrate, which is a workpiece to be processed, by an exposure system of 1:1. FIG. 7(a) is a plan view for showing a pattern image (for example, a letter of F) viewed from the side having a pattern of the phase shift mask of attenuated type; FIG. 7(b) is a cross-sectional view for showing a relation of arrangement of the exposure system when the resist pattern 21 is formed on the light transmittible substrate 7 using this phase shift mask of attenuated type; and FIG. 7(c) is a plan view for showing the pattern image viewed from the side having a pattern of the resist pattern 21 formed on the light transmittible substrate. In FIGS. 7(a) through 7(c), a numerical reference 1 designates a phase shift film of attenuated type; a numerical reference 7 designates the light transmittible substrate; and a numerical reference 21 designates the resist pattern.

As shown in FIG. 7(b), in an ordinary exposure system for transferring with magnification of 1:1, a photo mask and a workpiece are exposed under a positional relationship, in which a surface with the pattern formed of the photo mask and that of the workpiece are opposed to each other. Accordingly, the pattern image of the resist pattern 21 formed on the workpiece of the light transmittible substrate 7 by the phase shift mask of attenuated type becomes an image in which the left side is inverted right in comparison with the phase shift mask of attenuated type when it is viewed from the side having the pattern as shown in FIG. 7(c). Accordingly, in this embodiment, when a predetermined pattern is formed, a pattern of a photo mask (i.e. the first phase shift mask of attenuated type) for producing this should have been inverted so as to be the left side right.

As describe in the above, according to Embodiment 1, various transfer tests, various optical simulations and a large quantity of data for writing in an electron beam lithography system for optimizing optical proximity correction, which is different at each pattern size and at each pattern arrangement in the conventional technique, are no longer necessary and the cost for producing the photo mask is reduced and throughput is improved, because the optical proximity correction of the phase shift mask of attenuated type can be formed in a self-replicating manner by using the first phase shift mask of attenuated type produced based on the data of pattern of which left side is inverted right.

EMBODIMENT 2

In Embodiment 1, an optical proximity correction made of a shading film is formed. In this Embodiment 2, an optical proximity correction composed of apertures is formed.

FIGS. 8(a) through 8(d) and FIGS. 9(e) through 9(h) show cross-sectional views of a phase shift mask of attenuated type according to Embodiment 2, in which steps of a method of producing the phase shift mask are explained. These cross-sectional views are taken along a line V—V of the first phase shift mask of attenuated type shown in FIG. 1. In the Figures, a numerical reference 22 designates a first resist film; a numerical reference 23 designates a pattern of optical proximity correction; a numerical reference 24 designates a first resist pattern; a numerical reference 25 designates an aperture of resist pattern; a numerical reference 26 designates a second pattern; a numerical reference 27 designates an optical proximity correction; a numerical reference 28 designates an aperture of pattern; and a numerical reference 50 designates a pattern of concentrated apertures. The other references are portions the same as or similar to those shown in FIGS. 3(a) through 3(d) and FIGS. 4(e) through 4(h)As As shown in FIG. 8(a), a phase shift film of attenuated type 1 is formed as an optical member on a light transmittible substrate 7. In the next, as shown in FIG. 8(b), a positive resist film, namely, the first resist film 22, is formed on this phase shift film of attenuated type 1. As shown in FIG. 8(c), this positive resist film 22 is exposed using the first phase shift mask of attenuated type shown in FIG. 1 by an exposure system of 1:1, and thereafter it is developed to thereby form the first resist pattern 24 including the pattern of optical proximity correction 23 composed of apertures. The optical proximity correction is formed in a self-replicating manner in an area at which the optical proximity correction should be formed by a side lobe light generated by an overlap of an exposure light transmitted through a mask as described in Embodiment 1. At this time, a luminous exposure is adjusted such that the width $W_2$ of the aperture 25 in the first resist pattern 24 is narrower than the width $W_0$ of the aperture 2e in the first phase shift mask of attenuated type. The amount of reduction ($W_0-W_2$) is preferably about 0.15 $\mu$m in consideration of accuracy in process of producing the mask, as in Embodiment 1. Further, the wavelength of exposure light to be used therein is preferably the same as the wavelength of exposure light which is practically used at the time of producing the semiconductor device using the first phase shift mask of attenuated type 10, for example, an i-line beam (wavelength of 365 nm), a KrF laser beam (wavelength of 248 nm), an ArF laser beam (wavelength of 193 nm) or the like can be used. By using such wavelengths, it is possible to reproduce preferably the pattern of optical proximity correction 23 which is formed in correspondence with a side lobe light. As shown in FIG. 8(d), the phase shift mask of attenuated type 1 is etched using the first resist pattern 24 including the pattern of optical proximity correction 23 as a mask, and thereafter the unnecessary resist is removed, whereby the second pattern 26 including the optical proximity correction 27 made of the phase shift film of attenuated type is formed.

Figure 10:
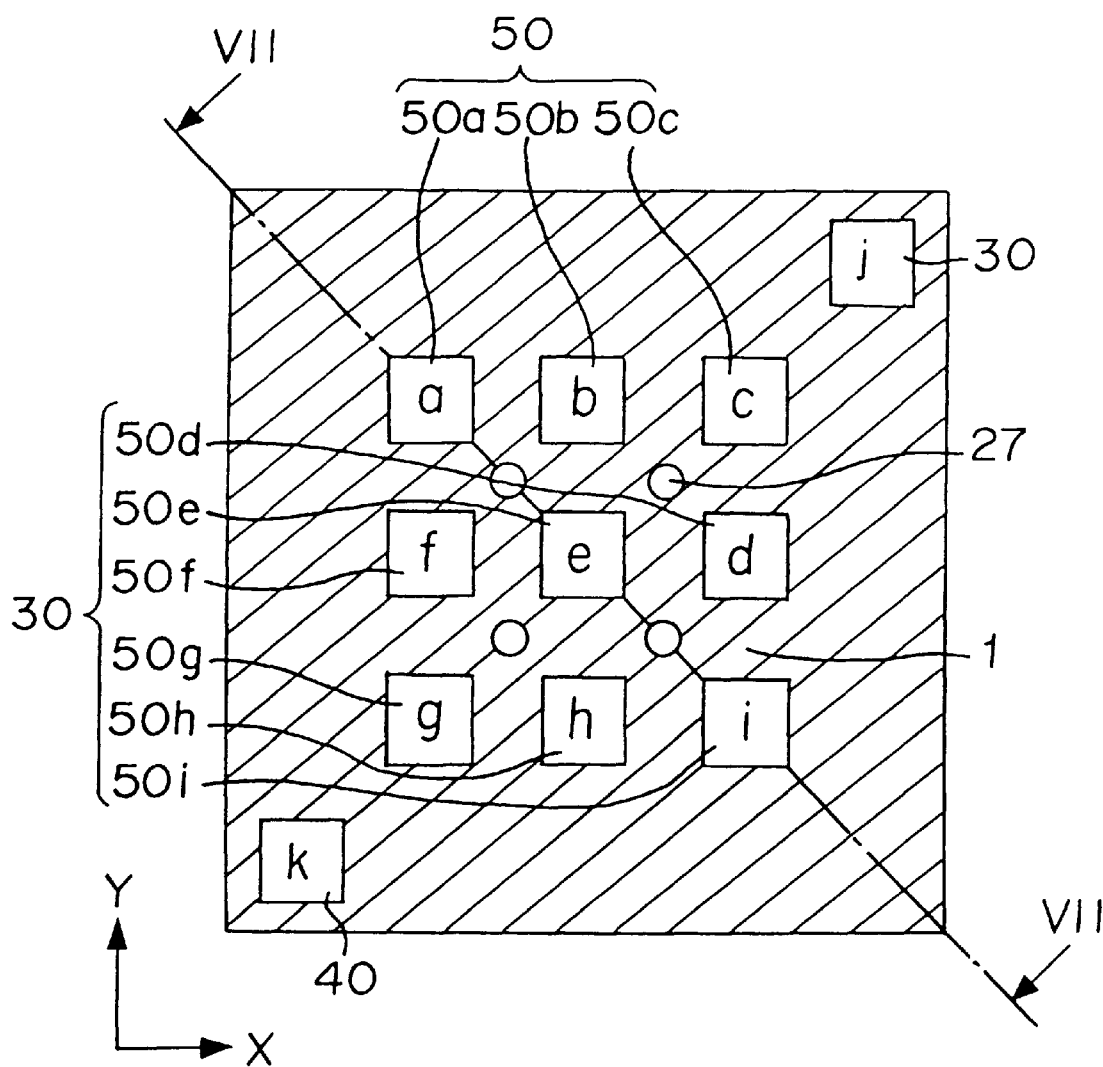
FIG. 10 is a plan view of a phase shift mask of attenuated type having an optical proximity correction in accordance with Embodiment 2 of the present invention.

As shown in FIG. 9(e), a resist for electron beam 8 is formed on the second pattern 26. As shown in FIG. 9(f), an electron beam is irradiated on the resist for electron beam 8 based on first data of pattern in an electronic lithography system; and thereafter it is developed to thereby obtain a resist pattern for electron beam 19. At this time, the resist pattern for electron beam 19 is formed on the second pattern 26 so as to cover the optical proximity correction 27 but not to cover the aperture 28 of the second pattern. This is because the width $W_2$ of the aperture 25 in the first resist pattern 24 is formed to be narrower than the width $W_0$ of the aperture 2e in the first phase shift mask of attenuated type, which is originally planed to be formed, and accordingly the width of the aperture 28 in the second pattern formed by etching it as a mask is thus narrow. As shown in FIG. 9(g), a part of the second pattern is etched using the resist pattern for electron beam 19 as a mask; and thereafter the unnecessary resist is removed, whereby the phase shift mask of attenuated type having the pattern with concentrated apertures 50 and the optical proximity correction 27 as shown in FIG. 9(h) is completed. FIG. 10 is a plan view of this phase shift mask of attenuated type.

In the next, the resist pattern formed on a wafer of a semiconductor device using this phase shift mask of attenuated type will be described.

In FIGS. 11(a) through 11(d) respectively show a cross-sectional view of the phase shift mask of attenuated type produced in accordance with the above-mentioned method taken along a line VI—VI of FIG. 10, amplitude of exposure light transmitted through the phase shift mask of attenuated type on the wafer surface, intensity of the exposure light on the wafer surface and a cross-sectional view of the formed positive resist pattern. In FIGS. 11(a) through 11(d), a numerical reference 321 designates a main peak light; a numerical reference 322 designates a side lobe light; a numerical reference 521 designates a positive resist pattern; and a numerical reference 522 designates an aperture in the resist. The other references designate portions the same as or similar to those shown in FIGS. 8(a) through 8(d) and FIGS. 9(e) through 9(h).

Figure 11A:
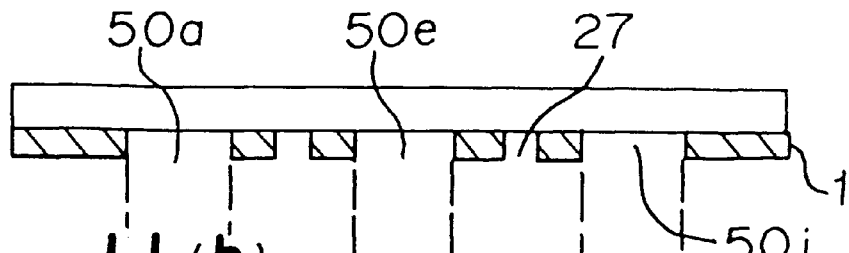
FIGS. 11(a) through 11(d) are schematical views for showing processes of forming a resist pattern in accordance with Embodiment 2 of the present invention.
Figure 11B:
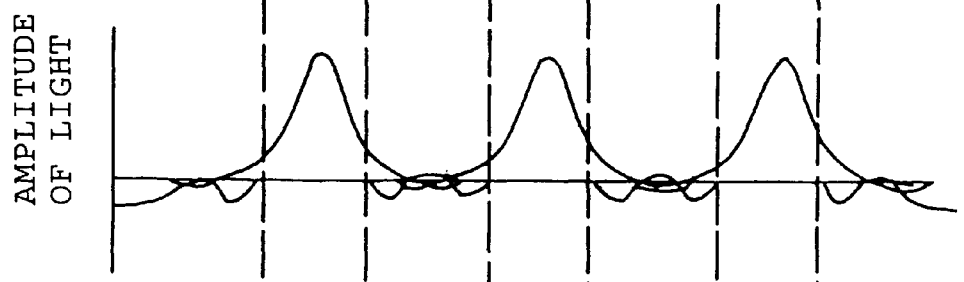
Figure 11C:
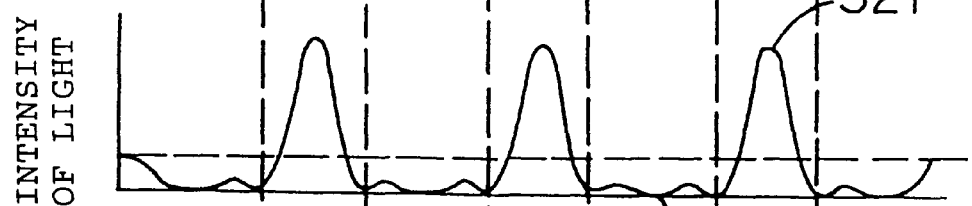
Figure 11D:
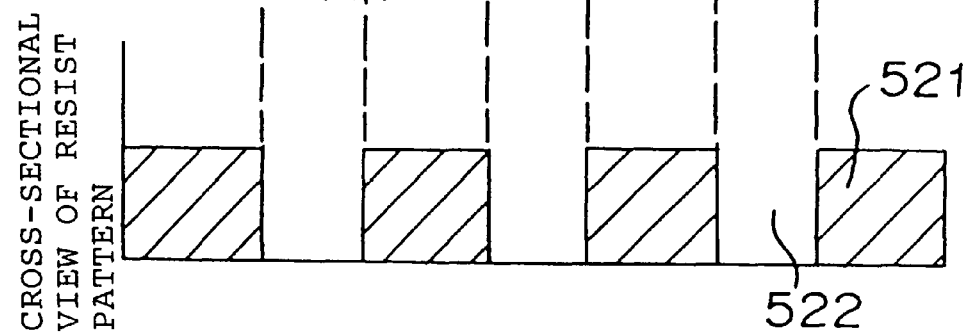

The exposure light transmitted through the phase shift mask of attenuated type is overlapped in an area subjected to the exposure by the exposure light transmitted through the phase shift film of attenuated type as shown in FIG. 11(b), and thereby the side lobe light 322 is generated as shown in FIG. 11(c). However, since the optical proximity correction 27 composed of apertures of phase shift film of attenuated type 1 is provided in a portion corresponding to the area, the intensity of side lobe light 322 caused by this overlap is extremely reduced. Accordingly, a loss of resist film is not caused by such side lobe light having weak intensity, whereby the resist pattern 521 having the aperture of resist 522 as designed can be formed as shown in FIG. 11(d).

As described in the above, according to this Embodiment 2, it is possible to reduce the cost of producing a photo mask and to improve throughput because the optical proximity correction in the phase shift mask of attenuated type can be formed in a self-replicating manner using the phase shift mask of attenuated type produced based on only the data of pattern, which is obtained by inverting the optical proximity correction so as to be the left side right; and thereby it is not necessary to conduct various transfer tests and various optical simulations for optimizing the optical proximity correction, which is different at each pattern size and/or at each pattern arrangement, and to prepare a vast amount of data for writing in an electron beam lithography system not like the conventional technique.

Figure 12:
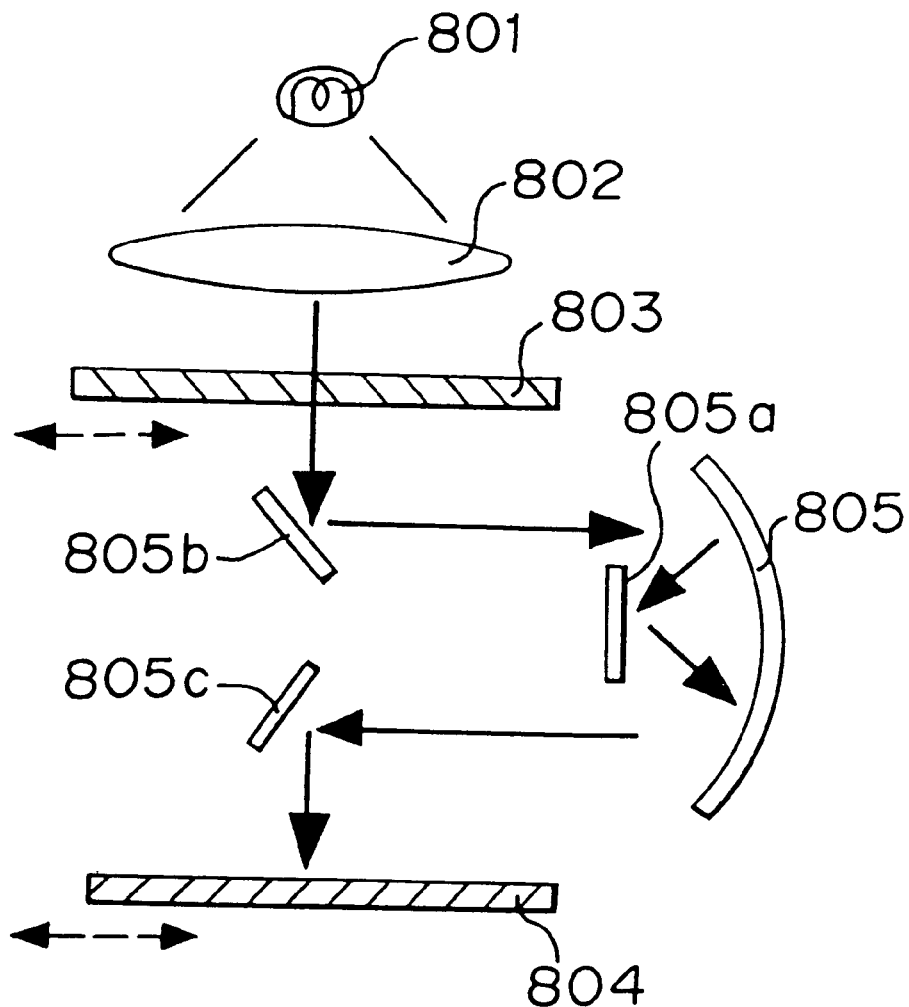
FIG. 12 schematically shows a structure of exposure system according to Embodiments 1 and 2 of the present invention.
Figure 13A:
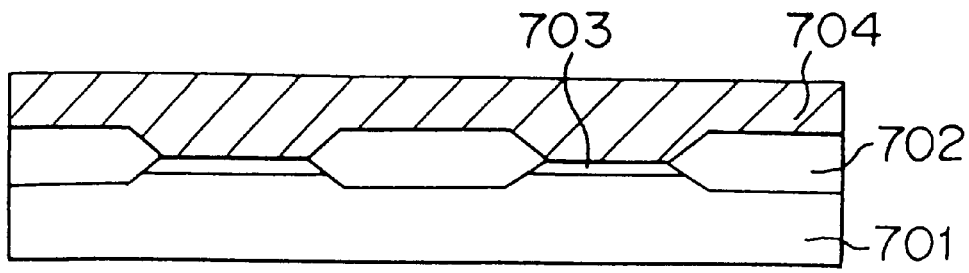
FIGS. 13(a) through 13(d) are cross-sectional views of semiconductor devices for explaining manufacturing processes in accordance with Embodiments 1 and 2.
Figure 13B:
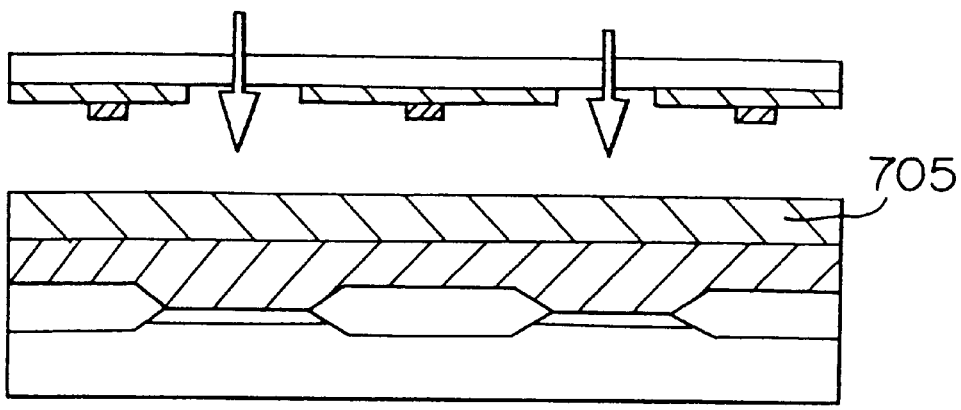
Figure 13C:
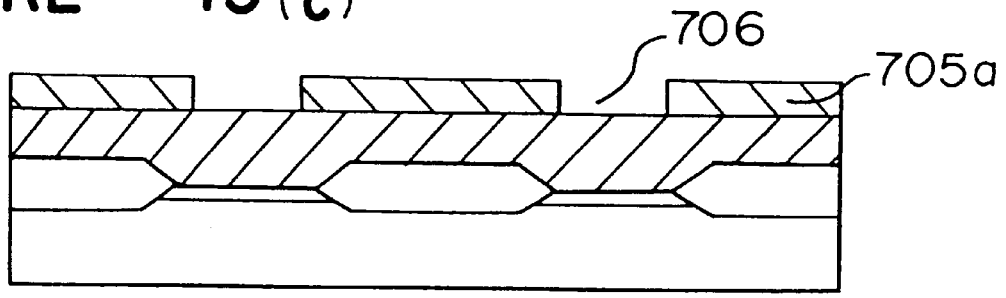
Figure 13D:
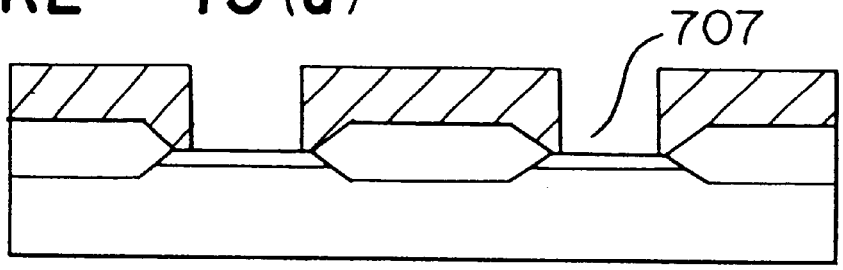
Figure 14E:
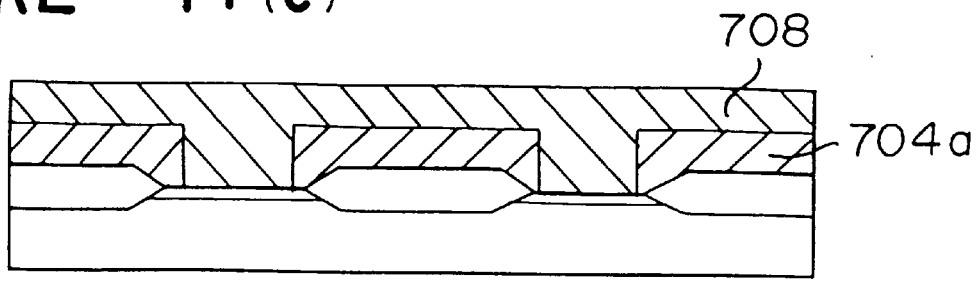
FIGS. 14(e) through 14(h) are cross-sectional views of semiconductor devices for explaining manufacturing processes in accordance with Embodiments 1 and 2.
Figure 14F:
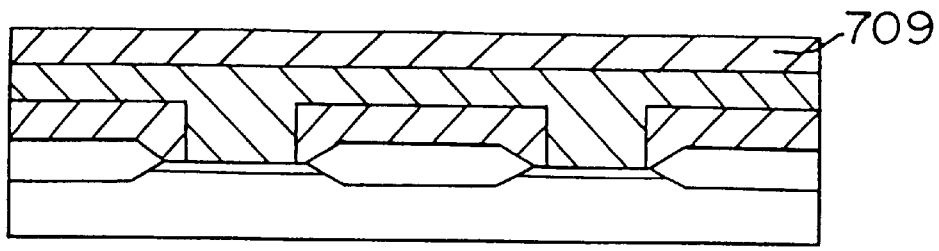
Figure 14G:
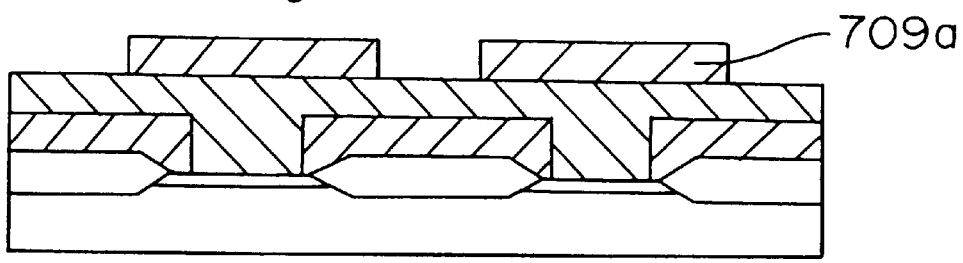
Figure 14H:
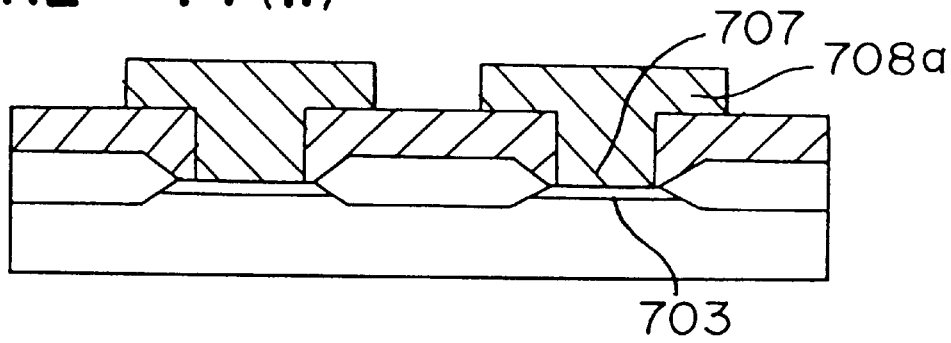
Figure 15:
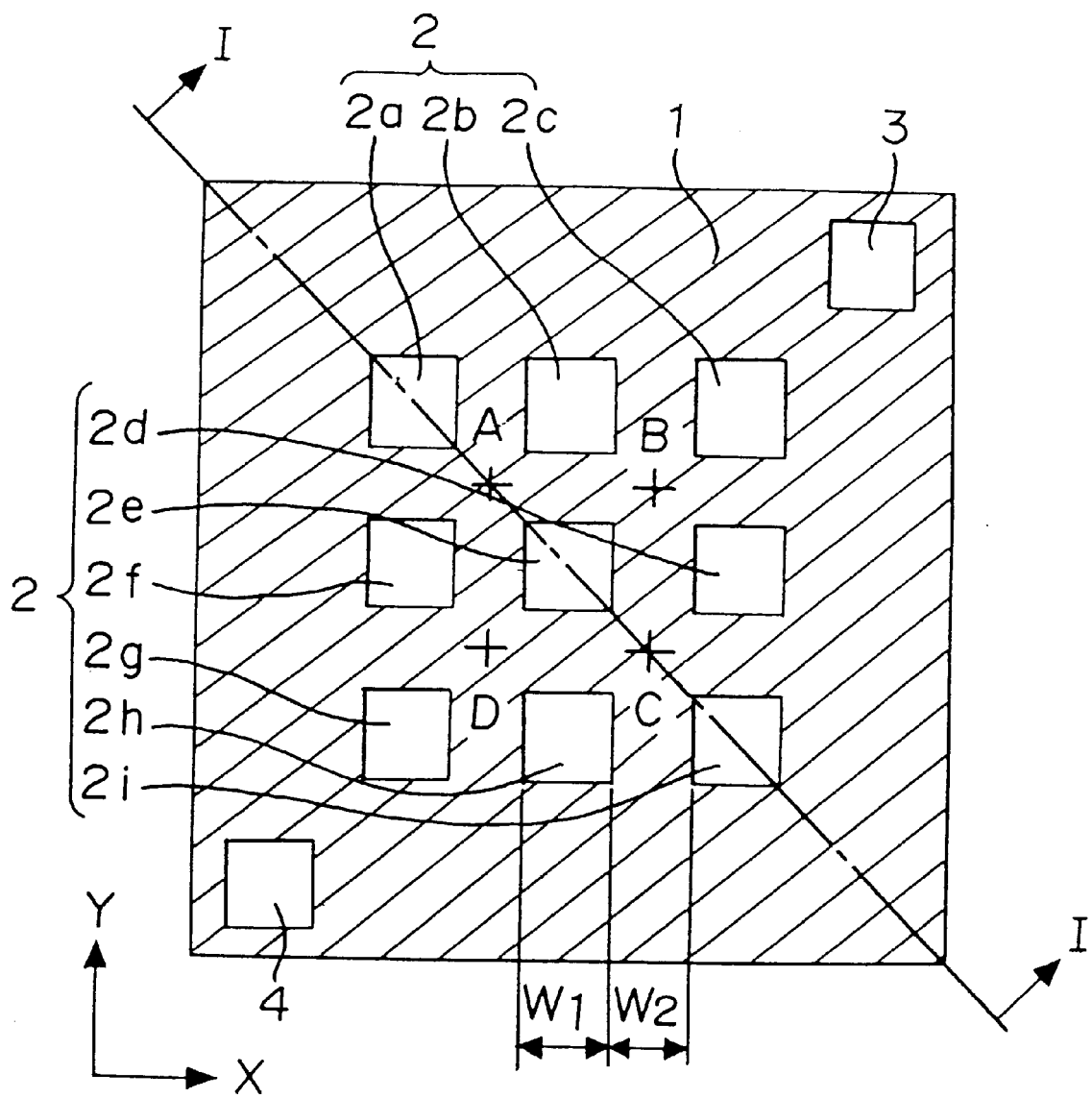
FIG. 15 is a plan view of a conventional phase shift mask of attenuated type.
Figure 17:
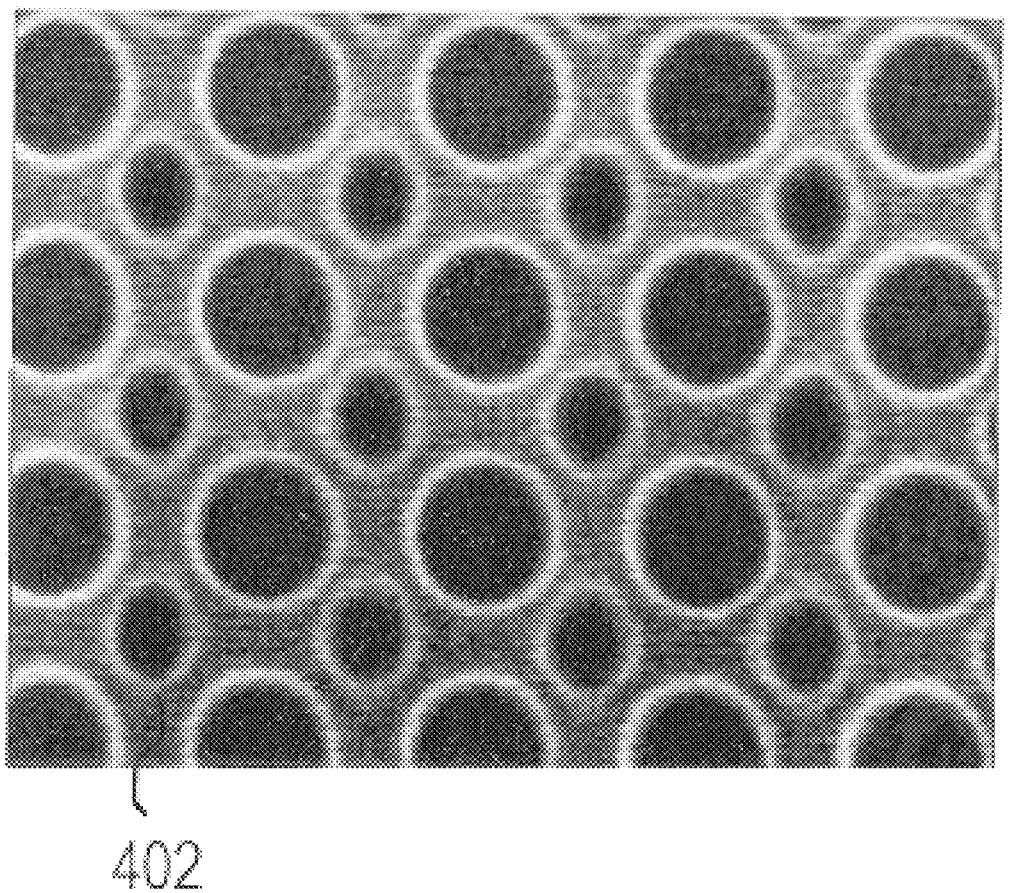
FIG. 17 is a photograph of a resist pattern formed using a conventional phase shift mask of attenuated type in a plan view taken by SEM.
Figure 18:
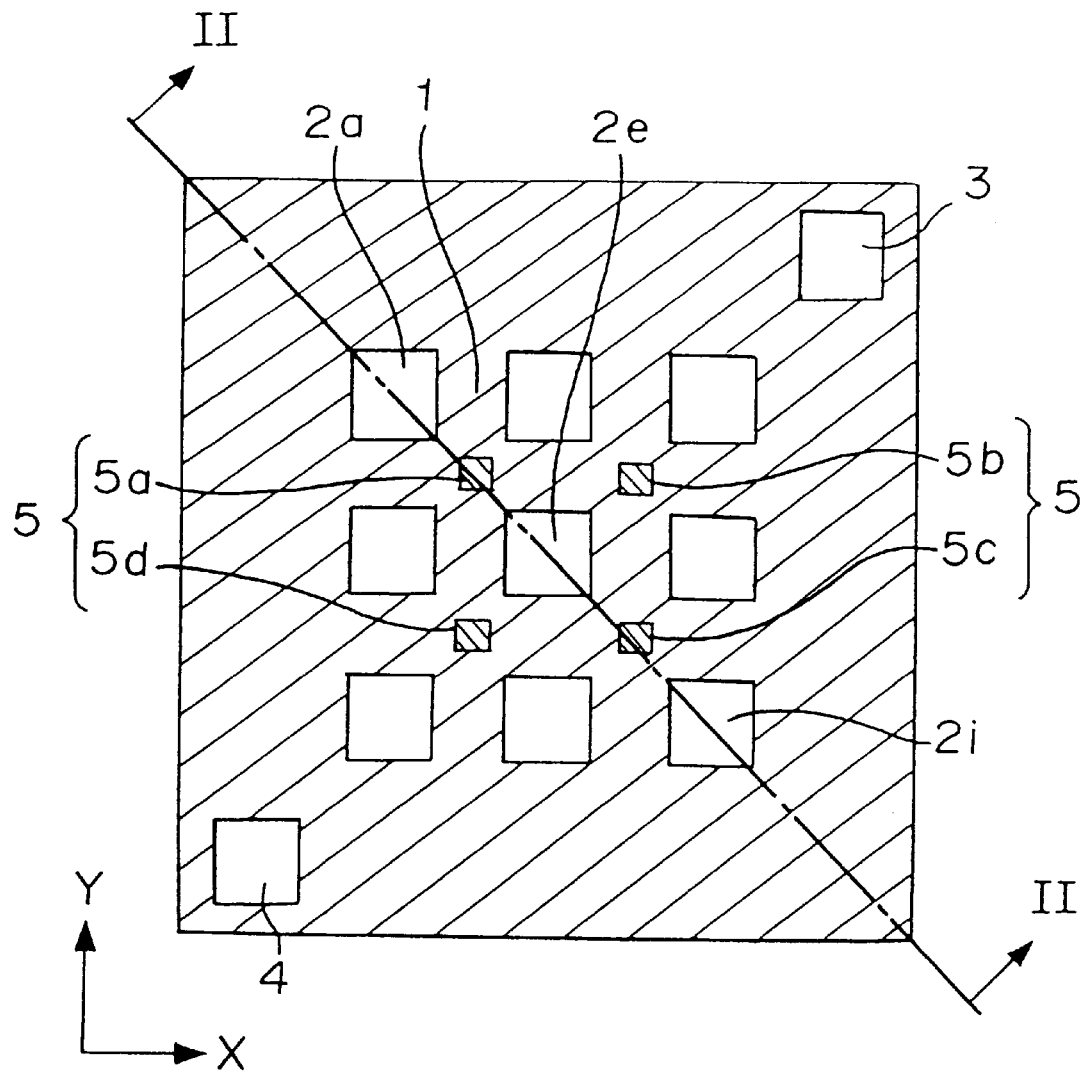
FIG. 18 is a plan view of a phase shift mask of attenuated type having a conventional optical proximity correction made of a shading film.
Figure 19:
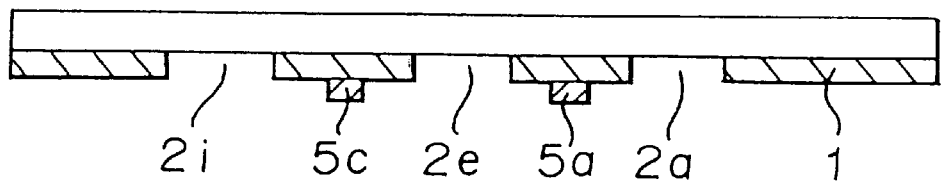
FIG. 19 is a cross-sectional view of a phase shift mask of attenuated type having a conventional optical proximity correction made of a shading film.
Figure 20:
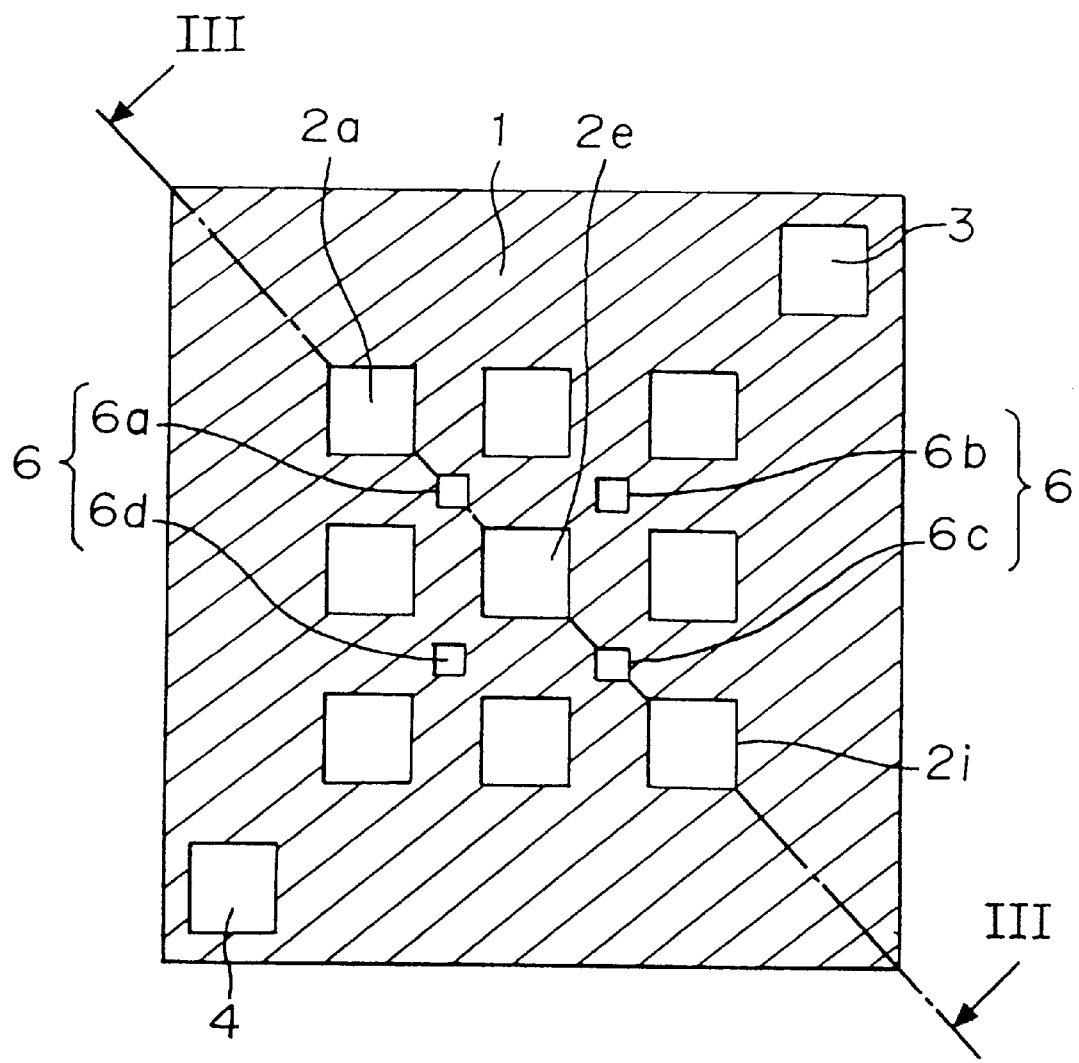
FIG. 20 is a plan view of a phase shift mask of attenuated type having a conventional optical proximity correction formed by apertures.
Figure 21:
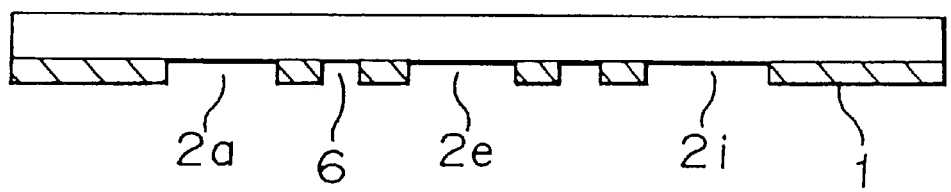
FIG. 21 is a cross-sectional view of a phase shift mask of attenuated type having a conventional optical proximity correction formed by apertures.
Figure 22A:
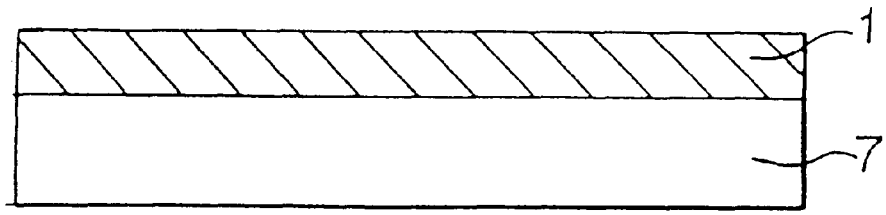
FIGS. 22(a) through 22(d) are cross-sectional views of a phase shift mask of attenuated type having a conventional optical proximity correction made of a shading film for explaining manufacturing processes.
Figure 22B:
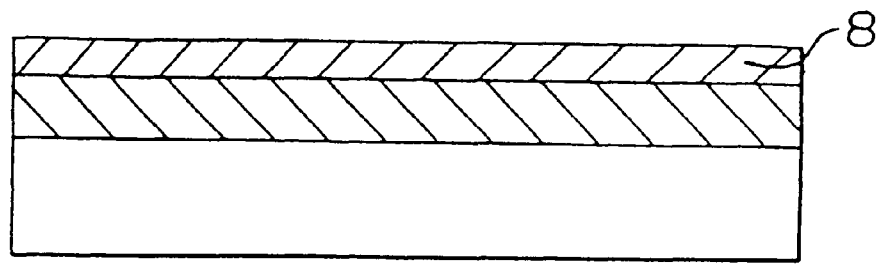
Figure 22C:
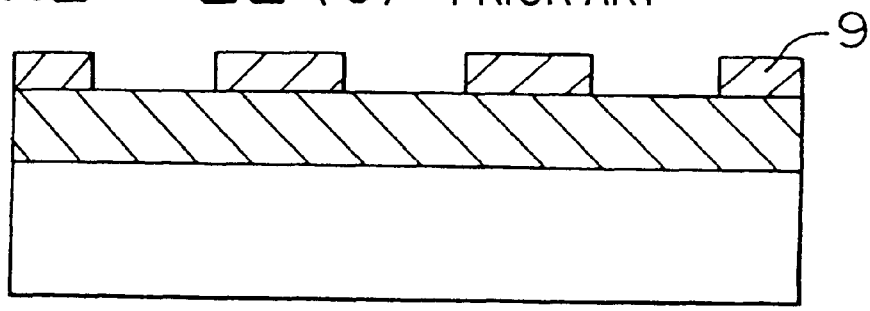
Figure 22D:
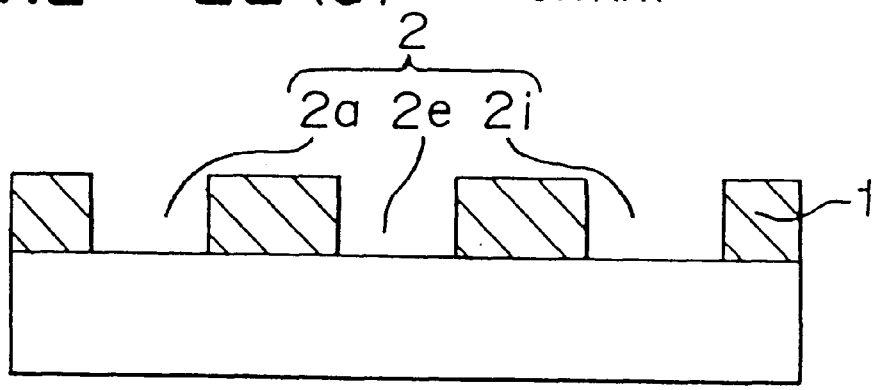

Meanwhile, as for the exposure system of 1:1, a mirror projection aligner as shown in FIG. 12 is used. In the Figure, a numerical reference 801 designates a light source; a numerical reference 802 designates an optical system including a condenser lens and so on; a numerical reference 803 designates a photo mask; a numerical reference 804 designates a workpiece; and a numerical reference 805 designates a light reflector.

In this mirror projection aligner, the photo mask 803 and the workpiece 804 can be isolated completely and high resolution is obtainable in comparison with a contact aligner or a proximity aligner, whereby this mirror projection aligner is most preferable.

In the next, a method of producing the semiconductor device using the phase shift mask of attenuated type having the optical proximity correction produced in accordance with Embodiments 1 and 2 will be described.

FIGS. 13(a) through 13(d) and FIGS. 14(e) through 14(h) show cross-sectional views of, for example, an integrated circuit of MOS transistor for explaining a method of forming contact holes for connecting a semiconductor substrate with electrodes.

In FIGS. 13(a) through 13(d) and FIGS. 14(e) through 14(h), a numerical reference 701 designates the semiconductor substrate; a numerical reference 702 designates a region of separating elements; a numerical reference 703 designates a region with impurity diffused; a numerical reference 704 designates an inter-layer insulating film; a numerical reference 705 designates a positive resist film; a numerical reference 706 designates an aperture of positive resist pattern; a numerical reference 707 designates a contact hole; a numerical reference 708 designates a metallic film; and a numerical reference 709 designates a positive resist film.

As shown in FIG. 13(*a*), the semiconductor substrate 701, the region of separating elements 702 and the region with impurity diffused 703, which are formed on the main surface of the semiconductor substrate 701, and the inter-layer insulating film 704, which is formed thereon, are provided. The semiconductor substrate 701 is, for example, a silicon substrate of P-type; the region of separating elements 702 has an ordinary localized oxidation of silicon (LOCOS) structure; and the region with impurity diffused 703 is an n type diffusion layer by implanting arsenic (As) or the like. The inter-layer insulating film 704 is made of, for example, a phospho silicate glass (PSG) film or the like. In the next, as shown in FIG. 13(*b*), the positive resist film 705 is coated on this inter-layer insulating film 704 and the positive resist film 705 is exposed by, for example, an i-line stepper of i-line beam using the phase shift mask of attenuated type having the optical proximity correction provided with a predetermined pattern according to the present invention. Thereafter, the positive resist film 705 is developed, to thereby obtain a positive resist pattern 705*a* as shown in FIG. 13(*c*). Further, as shown in FIG. 13(*d*), the inter-layer insulating film 704 is subjected to an etching by dry etching using the positive resist pattern 705*a* as a mask and also using, for example, etching gas of freon system, to thereby form the contact hole 707. Thereafter, the unnecessary resist is removed.

As shown in FIGS. 14(*e*) through 14(*h*), a metallic film 708 made of aluminum or the like is formed on the inter-layer insulating film 704, in which the contact hole 707 is formed. Further, as shown in FIG. 14(*f*) of FIG. 14, the positive resist film 709 is coated on this metallic film 708. As shown in FIG. 14(*g*), the positive resist film 709 is exposed using a photo mask provided with a predetermined pattern, and thereafter it is developed to thereby obtain a resist pattern 709*a*. At last, as shown in FIG. 14(*h*), the metallic film 708 is etched using the resist pattern 709*a* as a mask, and thereafter the unnecessary resist is removed, to thereby obtain a predetermined electrode 708*a* which is electrically connected with the impurity region 703 through the contact hole 707.

The present invention provides and effects of drastically reducing the production time and the manufacturing cost because it is not necessary to make data for writing the optical proximity correction at the time of forming by the electron beam lithography system, to conduct transfer tests and/or optical simulations both for optimizing, and to prepare very large amount of data for writing in the electron beam lithography system, as long as the optical proximity correction is formed in the self-replicating manner using the phase shift mask of attenuated type.

Obviously, numerous modifications and variations of the present invention are possible in light of the above teachings. It is therefore to be understood that within the scope of the appended claims, the invention may be practiced otherwise than as specifically described herein.

What is claimed is:

1. A method of producing a phase shift mask of attenuated type comprising:

a step of forming an optical member on a main surface of a light transmittible substrate, a step of forming a first resist film on said optical member, a step of forming a first resist pattern made of said first resist film using a first phase shift mask of attenuated type including a first pattern formed by a plurality of apertures provided in a phase shift film of attenuated type and arranged so as to produce side lobe lights, a step of forming a second pattern made of the optical member obtained by etching a part of said optical member using said first resist pattern as a mask, a step of forming a second resist film on said second pattern, a step of forming a second resist pattern made of said second resist film formed so as to cover at least portions of said second pattern in correspondence with the side lobe lights, and a step of etching the residual portions of said optical member using said second resist pattern as a mask.

2. A method of producing a phase shift mask of attenuated type according to claim 1, wherein a first data pattern of said first phase shift mask is formed based on a second data pattern obtained by converting the first data pattern in an electron beam lithography system so that the right side of said first data is inverted left.

3. A method of producing a phase shift mask of attenuated type according to claim 2, wherein said optical member is made of a phase shift film of attenuated type, and portions formed in correspondence with the side lobe lights are formed by apertures in said phase shift film of attenuated type.

4. A method of producing a phase shift mask of attenuated type according to claim 2, wherein said optical member is composed of a phase shift film of attenuated type and a shading film formed on said phase shift film of attenuated type, and said portions formed in correspondence with the side lobe lights are made of said shading film.

5. A method of producing a phase shift mask of attenuated type according to claim 3, wherein said first resist film is a positive resist, and a luminous exposure is adjusted such that the width of aperture in said first resist pattern formed in correspondence with one aperture in said first pattern of said first phase shift mask of attenuated type is narrower than the width of said one aperture of said first pattern.

6. A method of producing a phase shift mask of attenuated type according to claim 4, wherein said first resist film is a negative resist, and a luminous exposure is adjusted such that the width of the residual portion of said first resist pattern formed in correspondence with one aperture in said first pattern of said first phase shift mask of attenuated type is narrower than the width of said one aperture in said first pattern.

7. A method of producing a phase shift mask of attenuated type according to claim 1, wherein the wavelength of an exposure light for exposing said first resist film is the same as the wavelength of an exposure light used by an exposure system for producing a semiconductor device.

8. A method of forming a pattern on a wafer comprising:

a step of forming an optical member on a main surface of a light transmittible substrate, a step of forming a first resist film on said optical member, a step of forming a first resist pattern made of said first resist film using a first phase shift mask of attenuated type including a first pattern formed by a plurality of apertures provided in a phase shift film of attenuated type and arranged so as to produce side lobe lights, a step of forming a second pattern made of the optical member obtained by etching a part of said optical member using said first resist pattern as a mask, a step of forming a second resist film on said second pattern, a step of forming a second resist pattern made of said second resist film formed so as to cover at least portions of said second pattern in correspondence with the side lobe lights, and a step of etching the residual portions of said optical member using said second resist pattern as a mask to thereby obtain a phase shift mask of attenuated type, further comprising:

a step of transferring thus obtained pattern to the wafer using said phase shift mask.

* * * * *